(12) United States Patent
Mori et al.

(10) Patent No.: US 6,344,885 B1
(45) Date of Patent: Feb. 5, 2002

(54) LIQUID CRYSTAL DISPLAY DEVICE

(75) Inventors: Ikuko Mori; Takuo Kaitoh, both of Mobara; Hironobu Abe, Chiba; Masahiro Eto, Mobara; Toshihiro Satoh, Mobara; Kazuhiro Ishida, Mobara; Hajime Kudoh, Chiba, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/285,025

(22) Filed: Apr. 1, 1999

(30) Foreign Application Priority Data

Apr. 7, 1998 (JP) ............................. 10-094268

(51) Int. Cl.[7] ...................... G02F 1/136; G02F 1/1343; G02F 1/1333; G09G 3/36
(52) U.S. Cl. ............... 349/44; 349/42; 349/46; 349/38; 349/110; 345/93
(58) Field of Search .................... 349/46, 44, 110, 349/111, 38, 39; 345/93

(56) References Cited

U.S. PATENT DOCUMENTS 5,782,665 A * 7/1998 Weisfield et al. ............ 349/111
5,995,176 A * 11/1999 Sibahara ..................... 349/111
6,038,004 A * 3/2000 Nanno et al. ................. 349/38
RE36,836 E * 8/2000 Hayashi et al. ............... 349/44
6,115,088 A * 9/2000 Zhang et al. ................. 349/39

* cited by examiner

Primary Examiner—William L. Sikes
Assistant Examiner—Tarifur R. Chowdhury
(74) Attorney, Agent, or Firm—Antonelli, Terry, Stout & Kraus, LLP

(57) ABSTRACT

A liquid crystal display device capable of preventing a semiconductor element from malfunctioning due to the light which enters the semiconductor element from the display side opposed to a light source side. The liquid crystal display device comprises a first substrate (11), a second substrate and a liquid crystal sandwiched between the first substrate and the second substrate. The liquid crystal display device further comprises semiconductor elements (FG) formed over the first substrate and arranged in a matrix, and a light shielding film (BS) formed over the first substrate for blocking the light which would enter the semiconductor elements from the display face of the liquid crystal display device if not blocked.

20 Claims, 26 Drawing Sheets

(a) 
ILA1

(b) 
BS (c) 
ILA2

(d) 
FG (e) 
ILA3

(f) 
G (g) 
ILA4

(a)

(b)

(c)

(d)

(e)

(a)

(b)

(c)
| PSIN |
|---|
| SOG |
| P-TEDS |

LIQUID CRYSTAL DISPLAY DEVICE

BACKGROUND OF THE INVENTION

1. Field of the Invention

The present invention relates to a liquid crystal display device and, more particularly, to a technique which is effective when applied to a TFT (Thin Film Transistor) liquid crystal display device including poly-silicon transistors.

2. Related Art

As one liquid crystal display device of the prior art, there is known an active matrix liquid crystal display device which has active element in each pixel and in which the active elements are used for switching operation.

The feature of the active matrix liquid crystal display device is that since liquid crystal driving voltages (or gradation voltages) are applied to pixel electrodes through the active elements such as thin film transistors (TFT) or the like, no crosstalk occurs between the pixels. As a result, any special drive method for preventing the crosstalk as in the simple matrix liquid crystal display device need not be used, making multiple gradation display possible.

As one of the types of this active matrix liquid crystal display device, there is known a TFT active matrix liquid crystal display device which uses thin film transistors such as amorphous silicon transistors or poly-silicon transistors as the active elements.

Hereinafter, the amorphous silicon transistor will be referred to as the "a-SiTr", the poly-silicon transistor as the "P-SiTr", the TFT liquid crystal display device using amorphous silicon transistors as the "a-SiTFT liquid crystal display device", and the TFT liquid crystal display device using the poly-silicon transistors as the "P-Si-TFT liquid crystal display device".

The a-SiTFT liquid crystal display device is widely used as the display device for a personal computer and a TV set.

In the a-SiTFT liquid crystal display device, however, a drive circuit for driving the liquid crystal needs be disposed in the periphery of the liquid crystal display panel.

In recent years, on the other hand, the TFT liquid crystal display device using P-SiTr elements has been developed and used in a liquid crystal projector or a head-mounted (glasses type) display.

In this liquid crystal display panel of the P-SiTFT liquid crystal display device, as in the liquid crystal display panel of the a-SiTFT liquid crystal display device, the P-SiTr are arranged and formed in a matrix over a quartz or glass substrate.

Since the operating speed of the P-SiTr is higher than that of the a-SiTr, moreover, the peripheral circuit of the liquid crystal panel of the P-SiTFT liquid crystal display device can also be mounted on the common substrate.

Generally in the liquid crystal projector, the image is displayed by irradiating the liquid crystal display panel with light emitted from a light source(Lamp), by controlling the irradiating light to pass the liquid crystal display panel by means of the image formed on the liquid crystal display panel, and by projecting the control light onto the screen.

The thin film transistor disposed at each pixel is caused to malfunction by photoconduction caused when the transistor is irradiated with light.

In the liquid crystal panel of the TFT liquid crystal display device used in the liquid crystal display projector of the prior art, therefore, a light shielding film is provided on the light source side to prevent light from falling directly on the thin film transistors.

However, the image of higher brightness has been demanded as the image to be displayed by the liquid crystal display projector, so that the illuminance of the light source has a tendency to increase (to about 10 million luxes in the future).

As the illuminance of the light source increases, moreover, in the liquid crystal display panel of the TFT liquid crystal display device used in the liquid crystal display projector, there arises a problem that the thin film transistors are caused to malfunction not only by the light coming from the light source directly and entering into the thin film transistors but also by reflected light entering into the thin film transistors from the display face side opposed to the light source side.

SUMMARY OF THE INVENTION

Representative aspects of the invention to be disclosed herein will be briefly summarized in the following.

According to one aspect of the invention, there is provided a liquid crystal display device comprising:

opposing two substrates, at least one which is transparent, a liquid crystal layer interposed therebetween;

pixels formed over at least one of the two substrates and arranged in a matrix;

pixel electrodes and semiconductor elements provided in said pixels; and wherein each of said semiconductor elements includes a semiconductor layer with the first surface and the second surface, a first gate electrode located at the side of the first surface of said semiconductor layer, and a second gate electrode located at the side of the second surface of said semiconductor layer, and wherein said second gate electrode shades the light from the side of the second surface into the said semiconductor layer.

According to another aspect of the invention, there is provided a liquid crystal display device comprising:

a liquid crystal panel having a plurality of pixels;

pixel electrodes provided in the pixels ;

semiconductor elements provided in the pixels and having a semiconductor layer, a first control electrode and a second control electrode;

wherein said semiconductor layer formed between said first control electrode and said second control electrode; and each of said semiconductor elements is controlled by said first control electrode and said second control electrode to apply video signals to said pixel electrodes.

According to still another aspect of the invention, there is provided a liquid crystal display device comprising:

a first substrate and a second substrate;

a liquid crystal sandwiched between said first substrate and said second substrate;

a plurality of pixels formed over said first substrate;

semiconductor elements provided in the pixels;

a semiconductor layer constituting said semiconductor elements;

a gate electrode formed to the liquid crystal side against a semiconductor layer; and a light shielding film formed to the first substrate side against a semiconductor layer, wherein said semiconductor elements are controlled by control signals applied to said gate electrode and said light shielding film.

An object of the invention is to provide a technique of preventing the semiconductor elements of a liquid crystal display device from malfunctioning due to the light which falls on the semiconductor elements from the display face side opposed to the light source side.

Another object of the invention is to provide such a technique of decreasing the leakage current of the semiconductor elements provided in every pixels in a liquid crystal display device and increasing the ON current.

The aforementioned and other objects and novel features of the invention will made apparent from the following description, to be made with reference to the accompanying drawings.

DESCRIPTION OF THE PREFERRED EMBODIMENT

Figure 1:
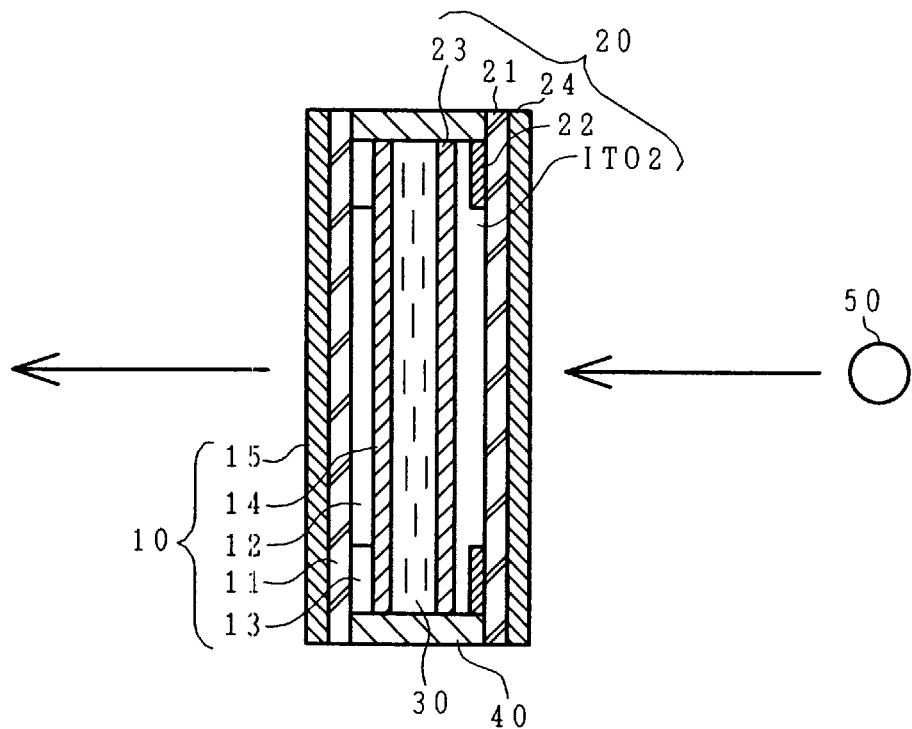
FIG. 1 is a cross-sectional viewing a schematic construction of a liquid crystal display panel of a liquid crystal display device of one embodiment of the invention.

Here will be described in detail an embodiment, in which the invention is applied to a TFT liquid crystal display device using poly-silicon transistors, with reference to the accompanying drawings.

Here, throughout all Figures for illustrating the embodiment, portions having identical functions are designated by common reference numerals, and their repeated description will be omitted.

FIG. 1 is a section showing a schematic construction of a liquid crystal display panel of a liquid crystal display device of one embodiment of the invention.

The liquid crystal display panel of the embodiment is constructed to include a TFT electrode substrate 10, a counter electrode substrate 20, and a liquid crystal 30 injected/sealed between the TFT electrode substrate 10 and the counter electrode substrate 20. In FIG. 1, reference numeral 40 designates a sealant, and numeral 50 designates a light source.

The counter electrode substrate 20 has a glass substrate 21, and a light shielding film 22, a common electrode (ITO2) and an alignment film 23 are sequentially formed on the surface of the glass substrate 21 on the liquid crystal 30 side.

Figure 2:
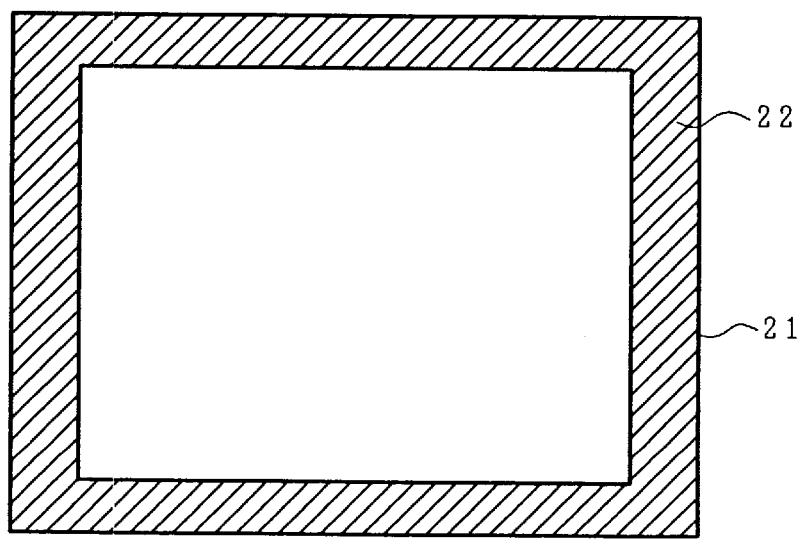
FIG. 2 is a diagram showing a region in which a light shielding film shown in FIG. 1 is formed.

This light shielding film 22 is formed exclusively on the periphery of the glass substrate 21, and a polarizing plate 24 is formed on the opposite surface of the glass substrate 21, as shown in FIG. 2.

The TFT electrode substrate 10 has a quartz substrate 11, and a pixel portion 12, a peripheral circuit portion 13 and an alignment film 14 are sequentially formed on surface of the quartz substrate 11 on the liquid crystal 30 side.

A polarizing plate 15 is formed on the opposite surface of the quartz substrate 11.

The light shielding film 22 is provided for preventing the light of the light source 50 from entering the peripheral circuit portion 13 and the peripheral circuit portion 13 from malfunctioning. The peripheral circuit portion 13 drives the thin film transistors (TFT) provided in the pixel portion 12 and is prevented by using the light shielding film 22 from being irradiated with light because it requires no light irradiation.

On the contrary, the pixel portion 12 is irradiated with light so that the transmitted or reflected light forms an image. Therefore, the entire face of the pixel portion 12 cannot be covered unlike the light shielding film 22. In the pixel portion 12, the light shielding film is formed to cover the semiconductor layer.

Figure 3:
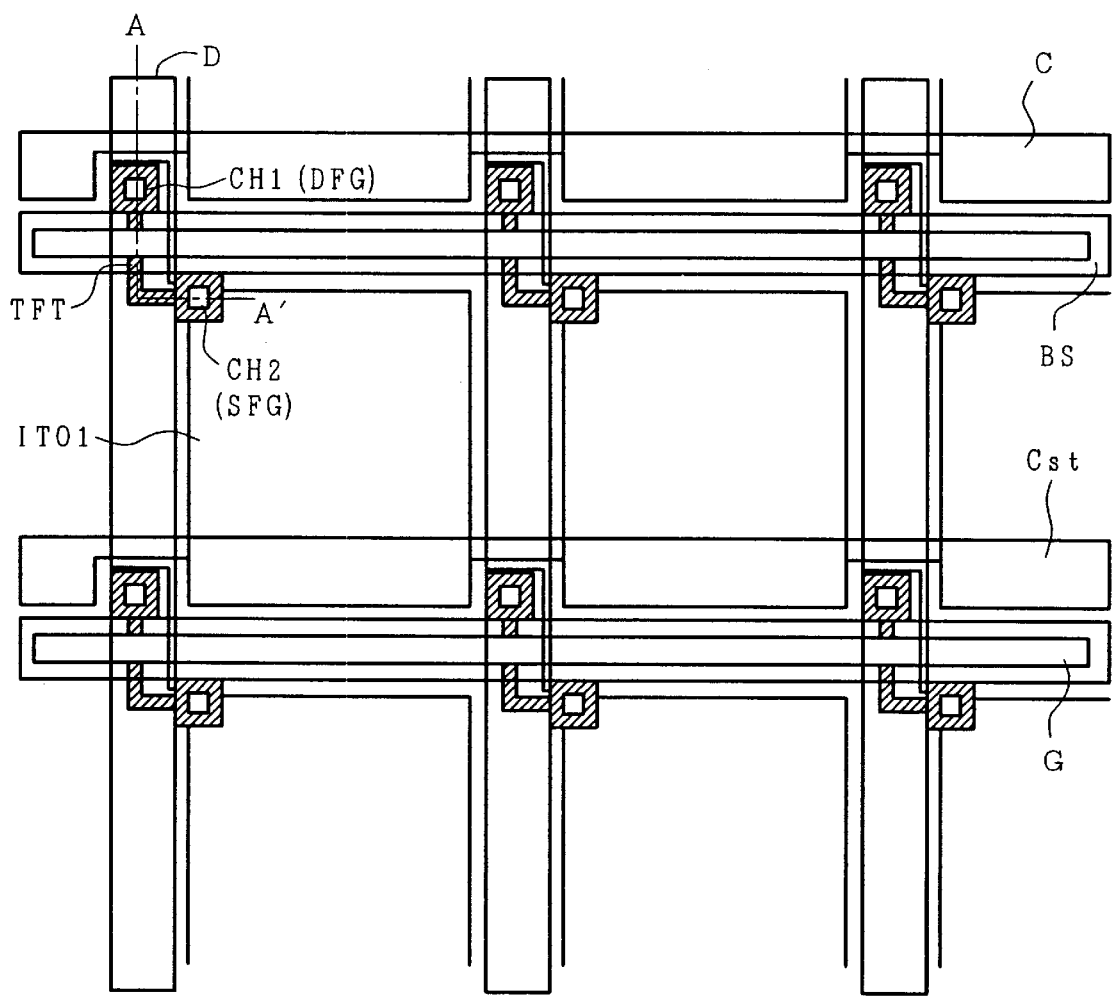
FIG. 3 is a diagram showing a schematic construction of a pixel portion of the liquid crystal display device shown in FIG. 1.

FIG. 3 is a diagram showing a schematic construction of the pixel portion 12 of the TFT electrode substrate 10 shown in FIG. 1.

As shown in FIG. 3, the pixel portion 12 of the TFT electrode substrate 10 has pixels arranged in a matrix. These individual pixels are arranged in the intersecting regions (regions surrounded by four signal lines) between two adjoining scanning signal lines (gate signal lines or horizontal signal lines) (G) and two adjoining video signal lines (drain signal lines or vertical signal lines) (D).

Each pixel has a thin film transistor (TFT), a pixel electrode (ITO1) and a storage capacitor (Cst).

The drain regions of the individual thin film transistors (TFT) of the individual columns of the individual pixels, arranged in a matrix, are individually connected with the video no signal lines (D), and the source regions of the individual pixels, as arranged in a matrix, are connected with the pixel electrodes (ITO1).

Here, the drain region and the source region are determined in principle by the intervening bias polarity. In the liquid crystal display device of this embodiment, the polarity is inverted during the operation so that the drain region and the source region are interchanged during the operation. In the description to be made, however, one is fixed as the drain region, and the other is fixed as the source region for conveniences.

The individual scanning signal lines (G) construct the gate electrodes of the individual thin film transistors (TFT) of the individual rows of the individual pixels, arranged in a matrix.

Moreover, the end portion of the pixel electrode (ITO1) is laid over a capacitor line (C) to constitute a storage capacitor (Cst).

Figure 4:
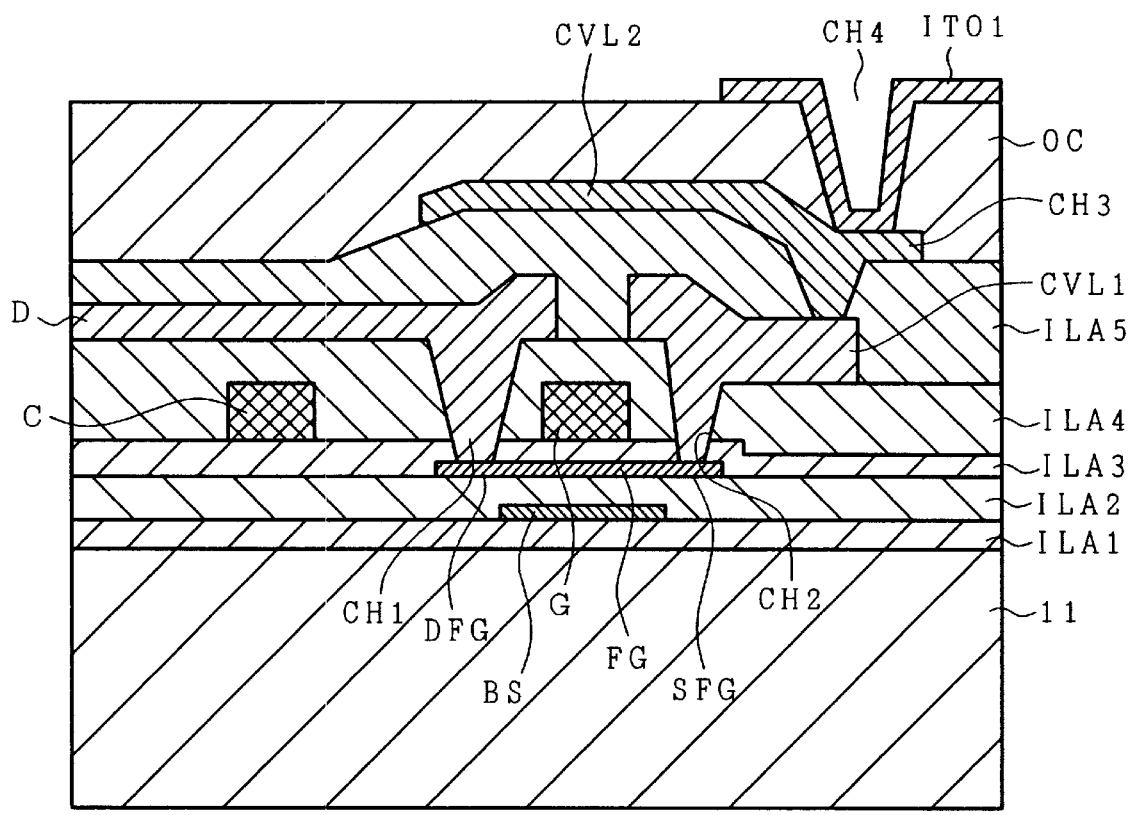
FIG. 4 is a cross-sectional viewing taken along line A–A' shown in FIG. 3.

FIG. 4 is a section taken along line A–' shown in FIG. 3. FIG. 3 shows layers including a layer for forming the video signal line (D) and the pixel electrode (ITO1) of the FIG. 4, but the connection from the video signal line (D) to the pixel electrode (ITO1) and the interlayer insulating films are omitted so that the construction of the individual portions may be easily understood.

As shown in FIG. 3, the thin film transistor (TFT) are formed in the intersecting regions between the video signal lines (D) and the scanning signal lines (G) and in parallel with the video signal lines (D) (or at right angles with respect to the scanning signal lines (G)).

The semiconductor layer of this thin film transistor (TFT) is a poly-silicon layer (FG), on the surface (the surface on the liquid crystal side) of which there are formed the scanning signal lines (G) acting as the gate electrodes through a second interlayer insulating film (ILA3) (although omitted from FIG. 3) acting as the gate insulating film.

In this embodiment, moreover, there is formed on the back (the face on the quartz substrate 11 side) of the poly-silicon layer (FG) a back light shielding film (BS) through a first interlayer insulating film (ILA2) (although omitted from FIG. 3) acting as the gate insulating film.

This back light shielding film (BS) is formed along the scanning signal lines (G) and made wider than the scanning signal lines (G) so that it can intercept the light which is reflected by the quartz substrate 11 and enters the thin film transistor (TFT), for example.

The drain region (DFG) of the thin film transistor (TFT) is connected through a through hole (CH1) formed in a third interlayer insulating film (ILA4) (although omitted from FIG. 3) to the video signal line (D) formed over the third interlayer insulating film (ILA4).

The source region (SFG) of the thin film transistor (TFT) is connected to a first conductor film (CLV1) through a through hole (CH2) formed in the third interlayer insulating film (ILA4) (although omitted from FIG. 3) and further to the pixel electrode (ITO1) through the first conductor film (CLV1) and a second conductor film (CLV2).

The poly-silicon layer (FG) is lowered in its resistance by implanting ions thereinto after the pattern is formed. In FIG. 4, the drain region (DFG) and the source region (SFG) are also lowered in their resistances by implanting ions thereinto to act as electrodes. In FIG. 3, the region having the through hole (CH1) corresponds to the drain region (DFG), and the region having the through hole (CH2) corresponds to the source region (SFG).

The connections from the first conductor film CLV1) to the pixel electrode (ITO1) will be described with reference to FIG. 4. The source region (SFG) of the thin film transistor (TFT) is connected through the through hole (CH2) formed in the third interlayer insulating film (ILA4) to the first conductor film (CLV1) formed over the third interlayer insulating film (ILA4). The first conductor film (CLV1) is connected through a through hole (CH3) formed in a fourth interlayer insulating film (ILA5) to the second conductor film (CLV2) formed over the fourth interlayer insulating film (ILA5). Moreover, the second conductor film (CLV2) is connected through a through hole (CH4) formed in a flattened film (OC) to the pixel electrode (ITO1) formed over the flattened film (OC).

Here, the second conductor film (CLV2) is extended over the fourth interlayer insulating film (ILA5) to the region of Poly-SiTr (FG) to form a front surface side light shielding film.

Figure 5A:
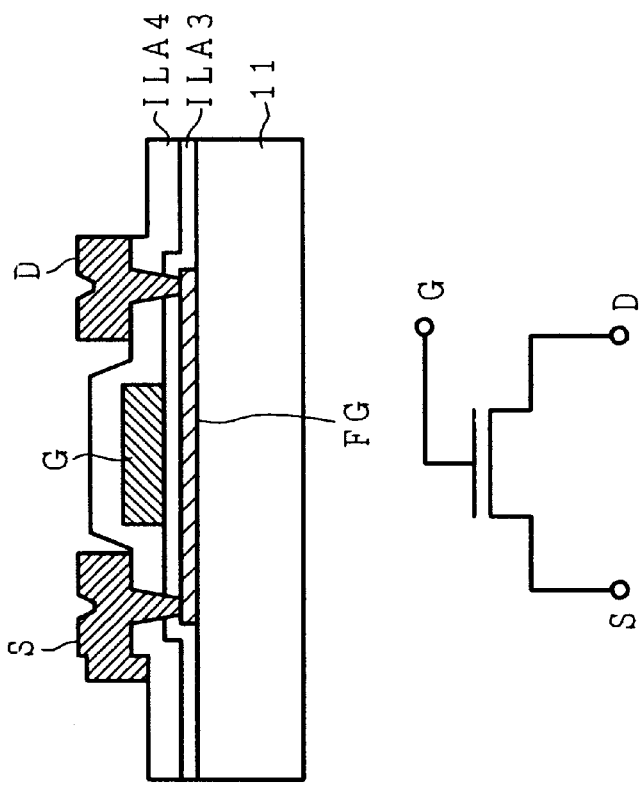
FIG. 5a shows diagrams illustrating equivalent circuits of a thin film transistor in the liquid crystal display device of the embodiment of the invention and FIG. 5b shows equivalent circuit of a thin film transistor of the prior art.
Figure 5B:
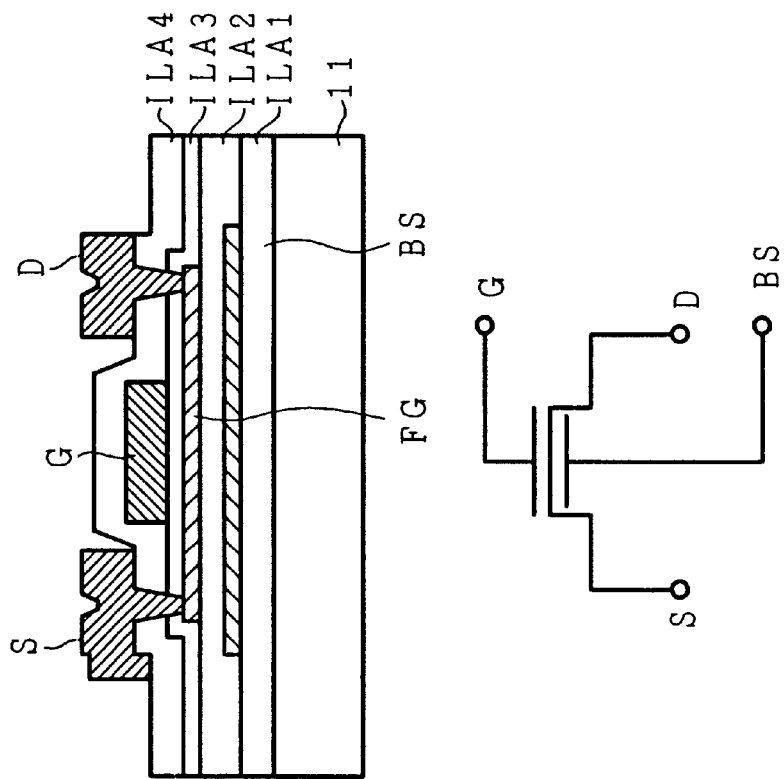

FIG. 5 shows diagrams illustrating equivalent circuits of the thin film transistor (TFT) of the pixel portion of this embodiment and the thin film transistor (TFT) of the prior art. FIG. 5(a) shows the equivalent circuit of the thin film transistor (TFT) of this embodiment, and FIG. 5(b) shows the equivalent circuit of the thin film transistor (TFT) of the prior art.

As seen from the equivalent circuit of FIG. 5(a), the thin film transistor (TFT) of this embodiment constitutes the thin film transistor (TFT) with a so-called "backgate electrode".

FIG. 6 shows graphs illustrating relations between a backgate voltage ($V_{BS}$) to be applied to the backgate electrode and a source/drain current ($I_{DS}$) in the thin film transistor (TFT) of this embodiment.

Figure 6A:
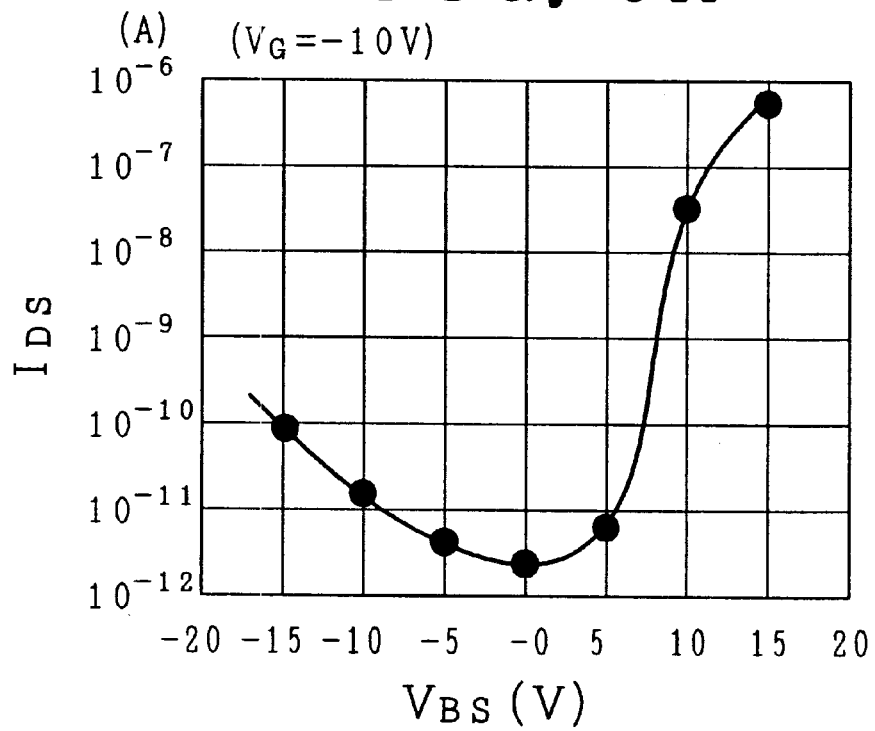
FIGS. 6A–6B shows graphs illustrating relations a backgate voltage to be applied to a backgate electrode and a source/drain current in the liquid crystal display device of the embodiment of the invention.

FIG. 6(a) is a graph illustrating the relation between the backgate voltage ($V_{BS}$) and the source/drain current ($I_{DS}$) when a gate voltage (Vgoff) for turning off the thin film transistor (TFT) is applied to the gate electrode.

When the gate voltage (Vgoff) for turning off the thin film transistor (TFT) is applied to the gate electrode, as seen from FIG. 6(a), the OFF current (or the so-called "leakage current") is minimized by applying the backgate voltage ($V_{BS}$) to the backgate electrode.

Figure 6B:
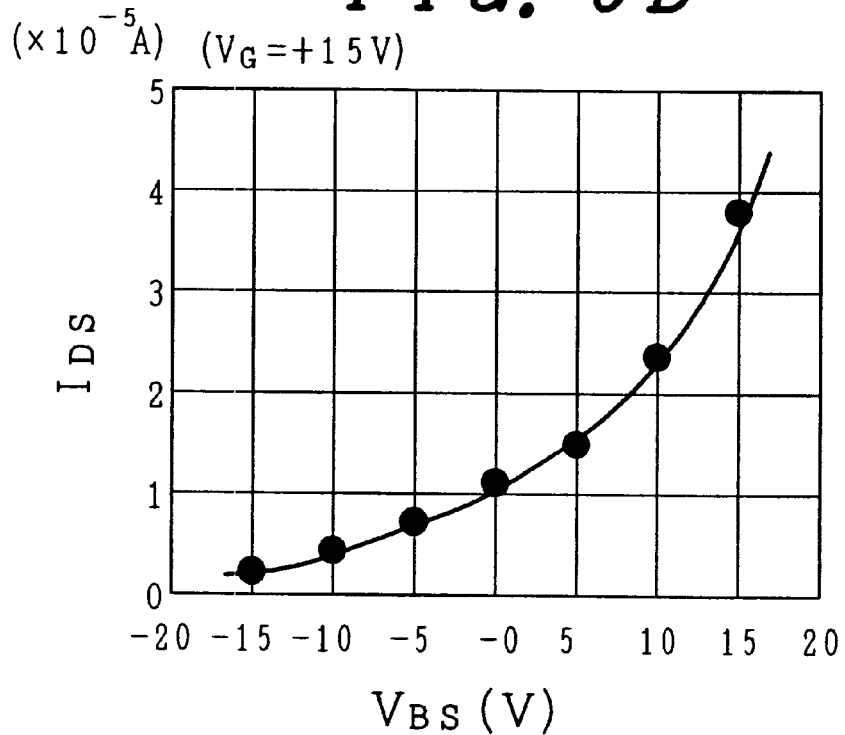

FIG. 6(b) is a graph illustrating the relation between the backgate voltage ($V_{BS}$) and the source/drain current ($I_{DS}$) when a gate voltage (Vgon) for turning on the thin film transistor (TFT) is applied to the gate electrode.

When the gate voltage (Vgon) for turning on the thin film transistor (TFT) is applied to the gate electrode, as seen from FIG. 6(b), the ON current can be increased by raising the voltage to be applied to the backgate electrode.

In this embodiment, a gate voltage (Vg) to be applied to the gate electrode is applied to the back light shielding film (BS) constituting the backgate electrode.

As a result, the back light shielding film (BS) is not formed in the drain region (DFG) and the source region (SFG), as shown in FIG. 3.

Figure 7:
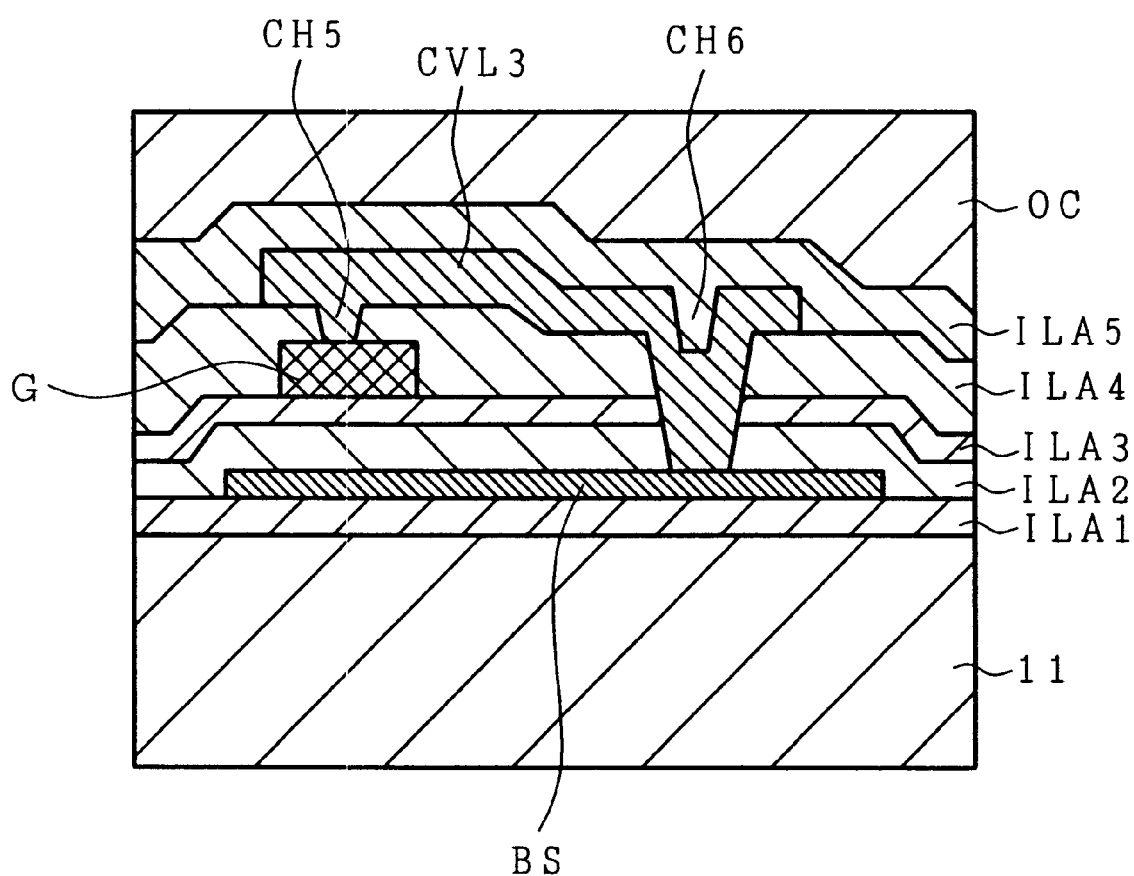
FIG. 7 is a cross-sectional viewing an essential portion for explaining a method of a back light shielding film and a scanning signal line in the liquid crystal display device of the embodiment of the invention.

As shown in FIG. 7, the back light shielding film (BS) and the scanning signal lines (G) are electrically connected in the peripheral portion of the pixel portion 12 of the TFT electrode substrate 10 shown in FIG. 1.

Here, FIG. 7 is a section showing an essential portion for illustrating a method of the back light shielding film (BS) and the scanning signal line (G). As shown, the scanning signal lines (G) is connected through a through hole (CH5) formed in the third interlayer insulating film (ILA4) with a third conductor film (CLV3) of Al or the like formed over the third interlayer insulating film (ILA4). The third conductor film (CLV3) and the back light shielding film (BS) are electrically connected through a through hole (CH6).formed in,the first interlayer insulating film (ILA2) to the third interlayer insulating film (ILA4) with the back light shielding film (BS) and the scanning signal lines (G).

Figure 8:
FIGS. 8a–8g show diagrams for illustrating a process for manufacturing a pixel portion of the liquid crystal display device shown in FIG. 1.
Figure 8:
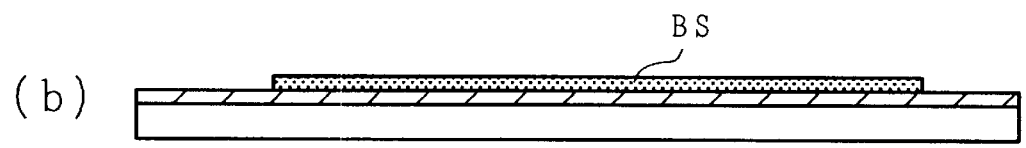
Figure 8:
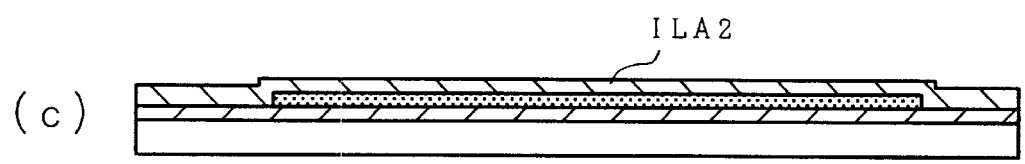
Figure 8:
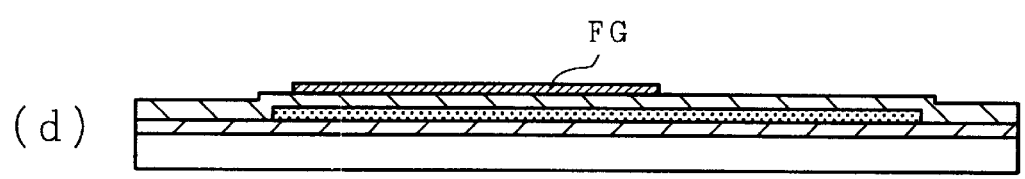
Figure 8:
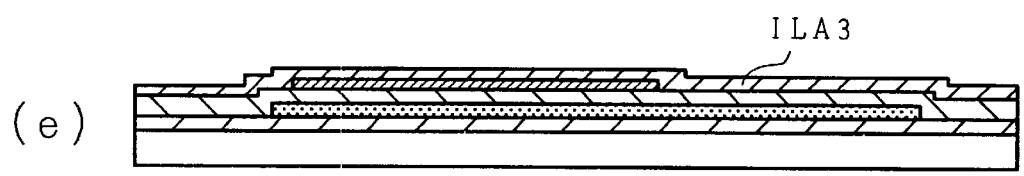
Figure 8:
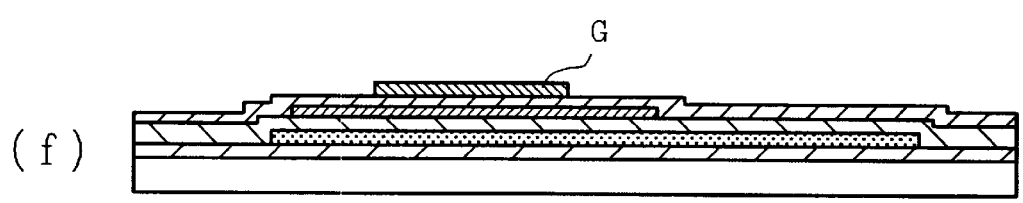
Figure 8:
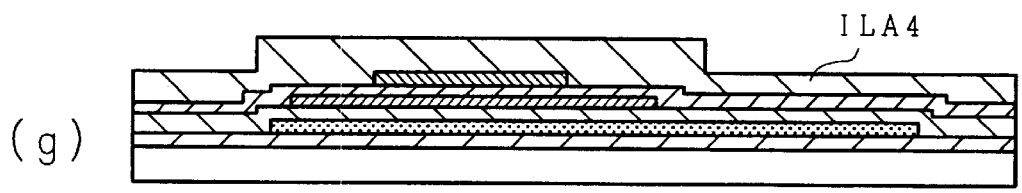
Figure 9:
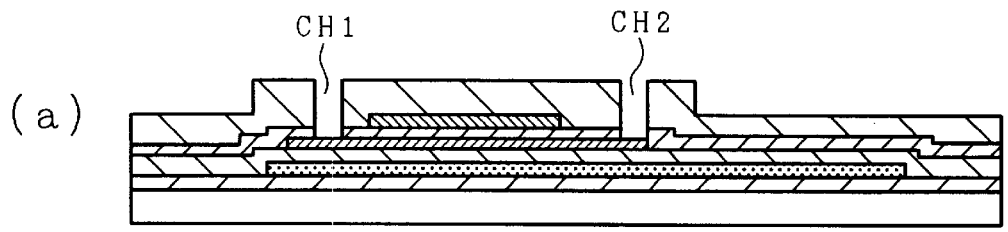
FIGS. 9a–9e show diagrams for illustrating the process for manufacturing a pixel portion of the liquid crystal display device shown in FIG. 1.
Figure 9:
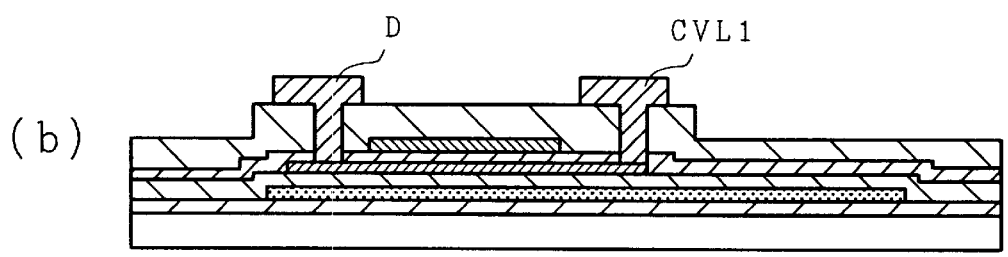
Figure 9:
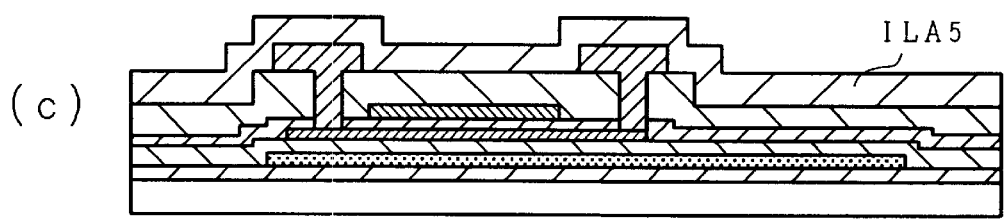
Figure 9:
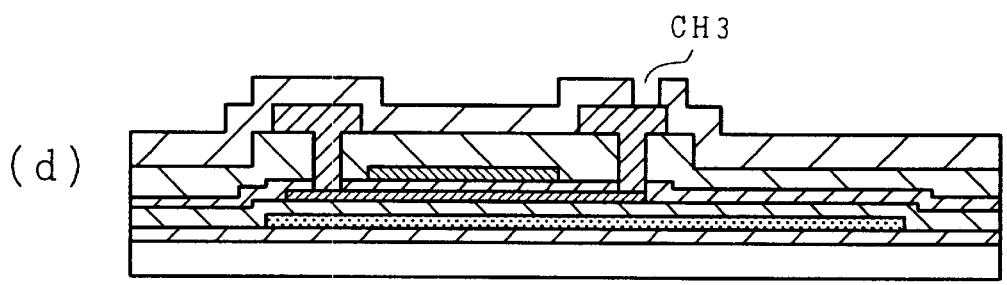
Figure 9:
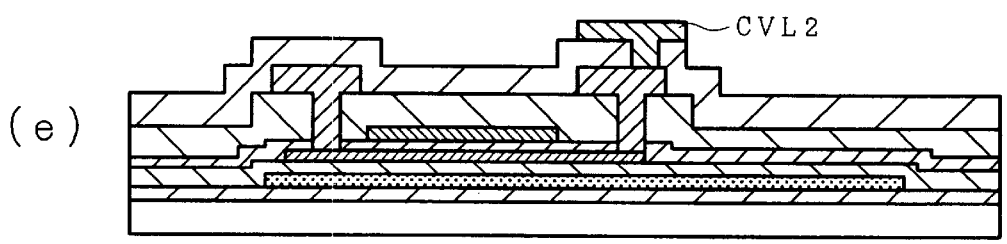
Figure 10:
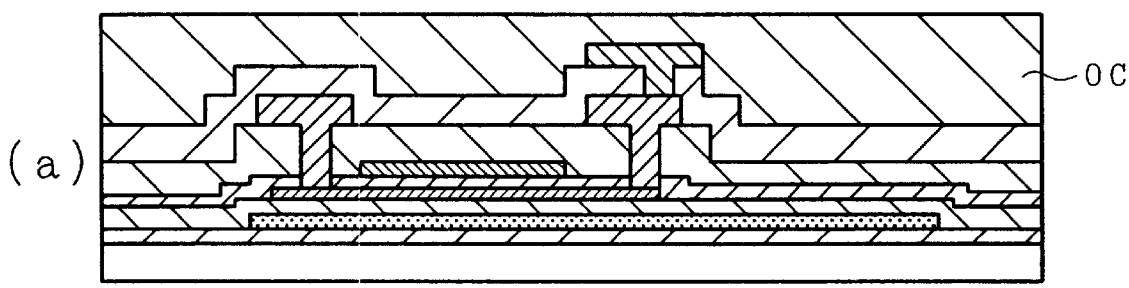
FIGS. 10a–10c show diagrams for illustrating the process for manufacturing a pixel portion of the liquid crystal display device shown in FIG. 1.
Figure 10:
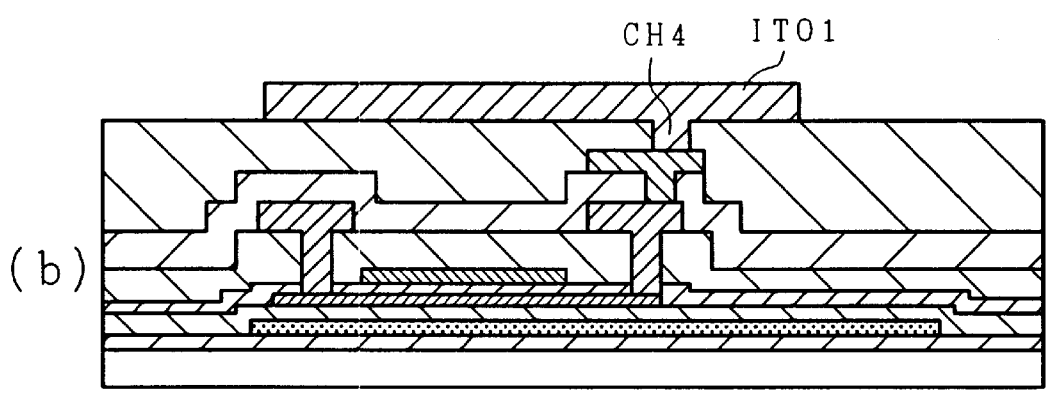

FIGS. 8 to 10 are diagrams for illustrating a process for manufacturing the pixel portion 12 of the TFT electrode substrate 10 shown in FIG. 1.

The process for manufacturing the pixel portion 12 of the TFT electrode substrate 10 shown in FIG. 1 will be described with reference to FIG. 8 to 10.

First, as shown in FIG. 8(a), an $SiO_2$ film is deposited on the quartz substrate 11 by a low-pressure CVD method, for example, to form a substrate insulating film (ILA1).

Next, as shown in FIG. 8(b), a metal film is formed over the substrate insulating film (ILA1) by a sputtering method, for example, and is then patterned to form the back light shielding film (BS).

Here, this back light shielding film (BS) is desirably made of a refractory metal material such as molybdenum, tungsten or titanium because it is subject to high temperature at a later-described step of forming Poly-SiTr(FG). Moreover, the back light shielding film (BS) is a metal silicide film partially or wholly on the side contacting with the $SiO_2$ film.

Next, as shown in FIG. 8(c), an $SiO_2$ film is deposited on the back light shielding film (BS) and the substrate insulating film (ILA1) by a low-pressure CVD method, for example, to form the first interlayer insulating film (ILA2) acting as a gate oxide film.

Next, as shown in FIG. 8(d), poly-silicon is deposited over the first interlayer insulating film (ILA2) by a CVD method, for example, and is then patterned to form the Poly-SiTr (FG).

Next, as shown in FIG. 8(e), an $SiO_2$ film is deposited on the Poly-SiTr(FG) and the first interlayer insulating film (ILA2) by a low-pressure CVD method, for example, to form a second interlayer insulating film (ILA3) acting as a gate oxide film.

Next, as shown in FIG. 8(f), poly-silicon is deposited on the second interlayer insulating film (ILA3) by a CVD method, for example, and is then patterned to form scanning signal lines (or the gate electrodes) (G).

Next, as shown in FIG. 8(g), an $SiO_2$ film and an $SiO_2$ film containing phosphorus are sequentially deposited on the scanning signal lines (G) and the second interlayer insulating film (ILA3), respectively, by the low-pressure CVD method and by a CVD method, for example, to form a third interlayer insulating film (ILA4).

Next, as shown in FIG. 9(a), the through hole (CH1) and the through hole (CH2) are formed in the third interlayer insulating film (ILA4).

Next, as shown in FIG. 9(b), a metal film of Al or the like is formed over the third interlayer insulating film (ILA4) by a sputtering method, for example, and is then patterned to form video signal lines (D) and a first conductor film (CVL1).

Next, as shown in FIG. 9(c), an $SiO_2$ film is deposited on the video signal lines (D), the first conductor film (CVL1) and the third interlayer insulating film (ILA4) by a CVD method using tetraethoxysilane gas as the source gas, for example, to form a fourth interlayer insulating film (ILA5).

Next, as shown in FIG. 9(d), a through hole (CH3) is formed in the fourth interlayer insulating film (ILA5).

Next, as shown in FIG. 9(e), a metal film of Al, Mo or the like is formed over the fourth interlayer insulating film (ILA5) by a sputtering method, for example, and is then patterned to form a second conductor film (CVL2).

Next, as shown in FIG. 10(a), a planarizing film (OC) is formed over the fourth interlayer insulating film (ILA5) and the second conductor film (CVL2).

As shown in FIG. 10(c), the planarizing film (OC) is an $SiO_2$ film deposited by a CVD method using tetraethoxysilane gas (TEOS) as the source gas, an SOG film formed by a spin-coating method, and an SiN film deposited by a plasma CVD method, for example.

Lastly, as shown in FIG. 10(b), after a through hole (CH4) is formed in the flattened film (OC), an ITO film is formed by a sputtering method, for example, and is then patterned to form a pixel electrode (ITO1).

Figure 11:
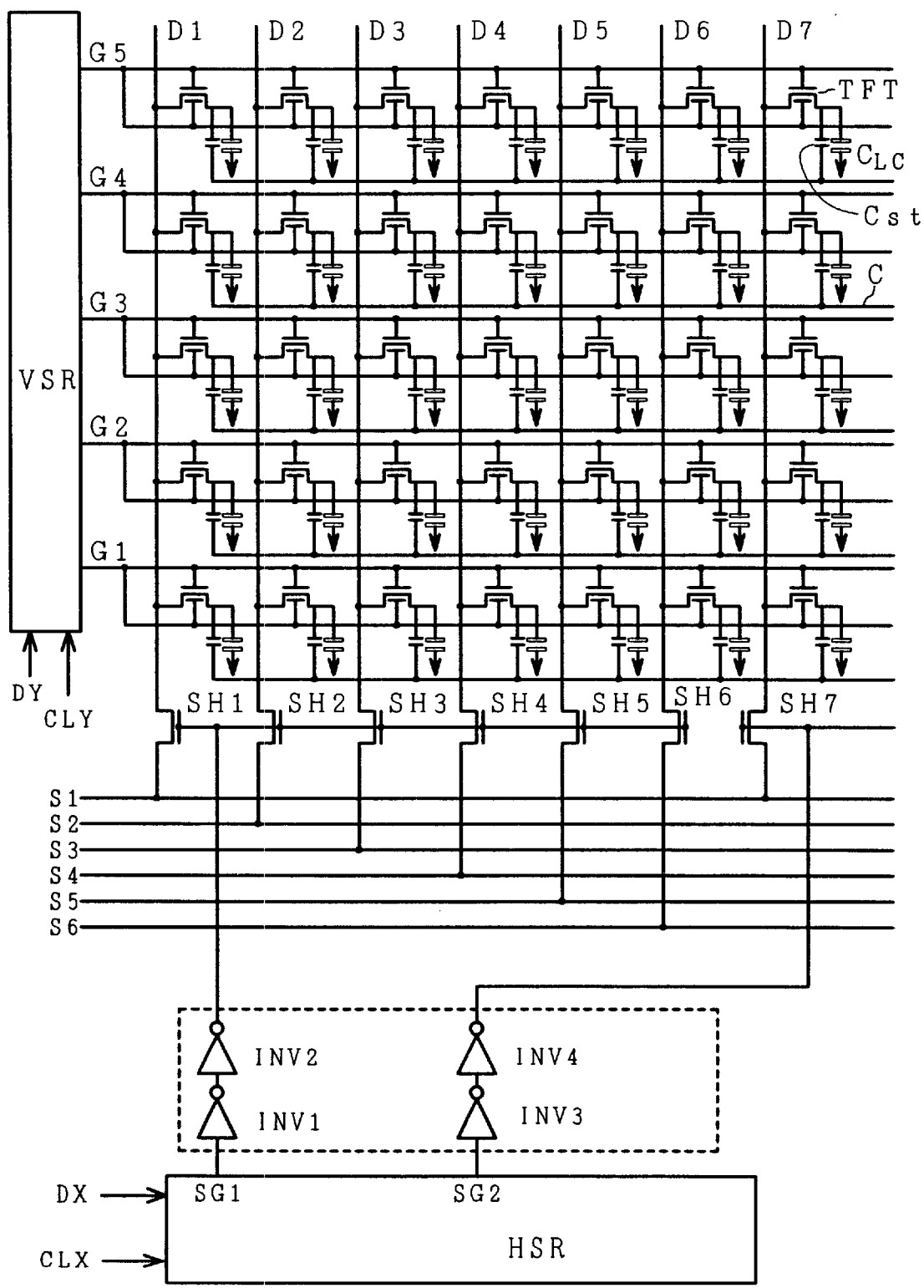
FIG. 11 is a diagram showing an equivalent circuit of the liquid crystal display device of the embodiment of the invention.

FIG. 11 is a diagram showing an equivalent circuit of the liquid crystal display panel of the Poly-SiTr-TFT liquid crystal display device of this embodiment.

Here, FIG. 11 is a circuit diagram so drawn as to correspond to the actual geometric arrangement. In the liquid crystal display panel of this embodiment, the number of scanning signal lines (G) is m, and the number of video signal lines (D) is n. In FIG. 11, however, only five scanning signal lines (G) and seven video signal lines (D) are shown.

Of the individual thin film transistor (TFT) of each column of the individual pixels arranged in a matrix, as described hereinbefore, the drain electrodes are connected to the video signal lines (D) connected to corresponding video signal lines (S1 to S6) through switching transistors (SH1 to SH7) constituting sample-hold circuits.

These switching transistors (SH1 to SH7) are divided into groups each having six transistors. The gate electrodes of the individual switching transistors (SH1 to SH6) (or SH7 to SH12 (although not shown)) of each group are fed through inverter circuits (INV1 to INV4) with the video signal capturing signals which are outputted from the individual output terminals (SG1, SG2) of a horizontal shift register (HSR).

The scanning signal lines (G) acting as the gate electrodes of the individual thin film transistors (TFT) of each row of the individual pixels arranged in a matrix are connected to a vertical shift register (VSR).

The individual thin film transistors (TFT) conducts, when a positive bias voltage is applied to the gate electrodes, and ceases to conduct when a negative bias voltage is applied to the gate electrodes.

Since a liquid crystal layer is formed between the pixel electrode (ITO1) and the common electrode 22, a liquid crystal capacitor ($C_{LC}$) is equivalently connected to each pixel electrode (ITO1), and a voltage of a potential (Vcom) to be applied to the common electrode 22 is applied to capacitor lines (C) shown in FIG. 11.

These switching transistors (SH1 to SH7), horizontal scanning shift register (HSR), inverter circuits (INV1 to INV4) and vertical scanning shift register (VSR) are packaged in the liquid crystal display panel and are made of Poly-SiTr like the thin film transistors (TFT) over the common substrate.

Here will be outlined the operation of the liquid crystal display panel shown in FIG. 11.

The vertical scanning shift register (VSR) shown in FIG. 11 selects the scanning signal lines (G) sequentially in response to a start pulse (DY) and a vertical driving clock signal (CLY) to output a positive bias voltage to the selected scanning signal line (G).

As a result, the thin film transistor (TFT) using the gate electrode of the selected scanning signal line (G) is turned on.

The horizontal scanning shift register (HSR) outputs video signal capturing signals sequentially from the individual output terminals in response to a start pulse (DX) and a horizontal driving clock signal (CLX).

These video signal capturing signals are sequentially amplified in current by the inverter circuits (INV1 to INV4) and are fed to the gate electrodes of the individual switching transistors (SH1 to SH7).

As a result, the individual switching transistors (SH1 to SH6 or SH7 to SH12) forming each group are turned on, so that the sexpartite video signals are outputted from the video signal lines (S1 to S6) to the corresponding six video signal lines (D).

As a result, the sampled video signals (their voltages) are written in the pixels which correspond to the thin film transistor (TFT) using the selected scanning signal line (G) as the gate electrode, and are displayed on the liquid crystal display panel.

The horizontal scanning shift register (HSR) and the inverter circuits (INV1 to INV4) constitute a horizontal scanning circuit, and the horizontal scanning shift register (HSR) has n/N output terminals where the number of video signal lines (D) is n, and the number of phases for separate driving (scanning) the video signal lines (D) is N.

The vertical scanning shift register (VSR) constitutes a vertical scanning circuit.

Here in the liquid crystal display panel shown in FIG. 11, reference symbols SG1 and SG2 designate the first and second output terminals of the horizontal scanning shift register (HSR), respectively.

Figure 12:
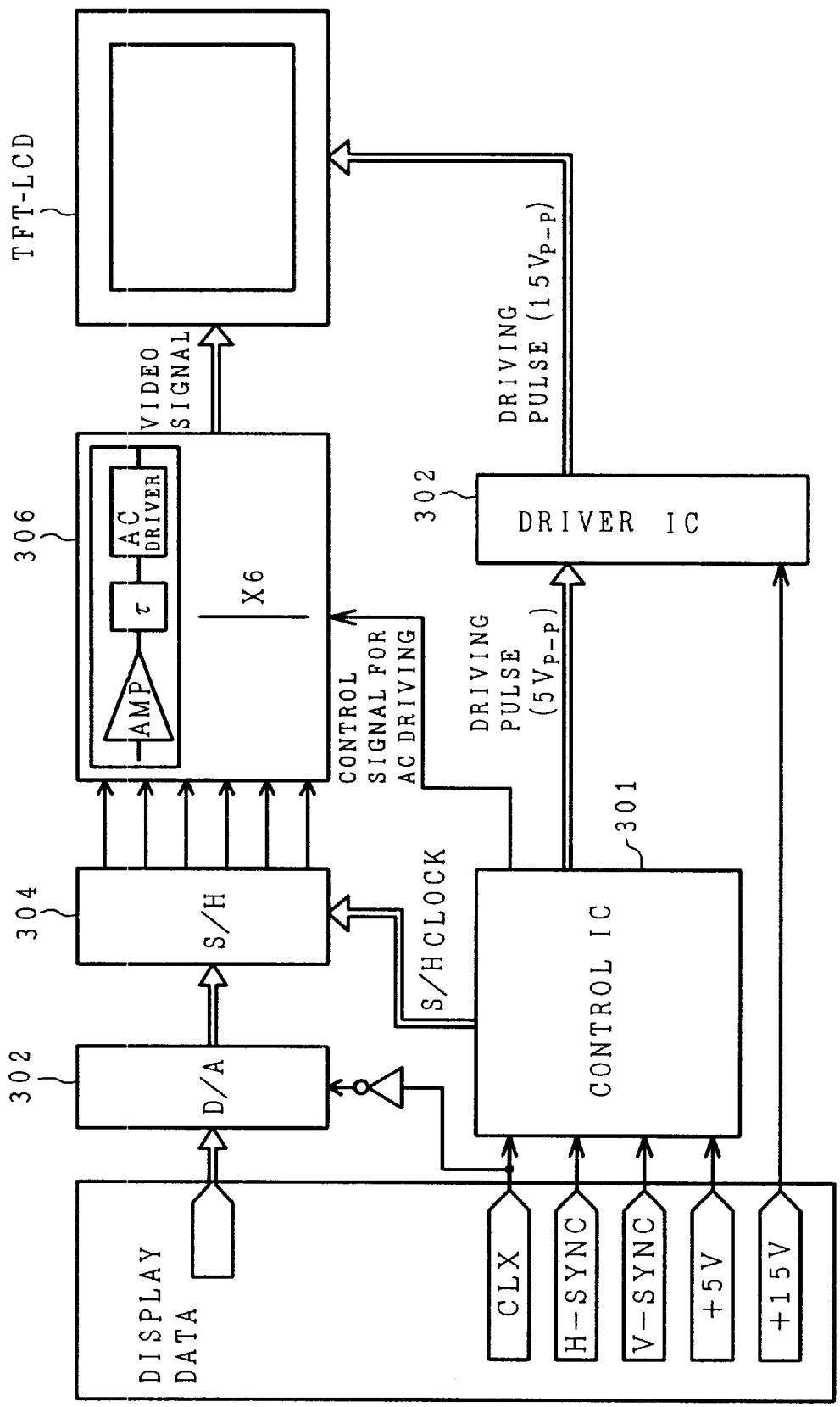
FIG. 12 is a block diagram showing a schematic circuit construction of peripheral circuits of the liquid crystal display device shown in FIG. 11.

FIG. 12 is a block diagram schematically showing the circuit construction of the peripheral circuits of the liquid crystal display device shown in FIG. 11.

In FIG. 12: reference symbol TFT-LCD designates a liquid crystal display panel; numeral 301 a control IC circuit; numeral 302 a digital/analog (D/A) converter; numeral 304 a sample-hold circuit; numeral 305 a driver IC circuit; and numeral 306 a signal processing circuit.

The display data (one of R (red), G (green) and B (blue)) sent from the main body are converted into analog video signals by the D/A converter 302.

Here, this D/A converter 302 can be dispensed with if the video signals are fed from the main body.

In the liquid crystal display panel shown in FIG. 11, the video signal lines (D) are driven (scanned) in six phases so that the video signals need to be accordingly separated into six phases.

Therefore, the video signals from the D/A converter 302 are divided into the six phases by the sample-hold circuit 304 on the basis of the sampling/holding (S/H) clocks synchronized with the horizontal driving clock signals (CLX).

Moreover, the timings of the video signals divided in the six phases are adjusted to the same phase and outputted from the sample-hold circuit 304.

Moreover, the video signals divided to the six phases are subjected in the signal processing circuit 306 to amplification, γ processing and conversion to AC signals and are fed to the video signal lines (S1 to S6) of the liquid crystal display panel (TFT-LCD).

Here, the γ processing is a signal processing for correcting the gamma characteristics of the liquid crystal layer, and the alternating processing is a signal processing for preventing a DC voltage from being applied to the liquid crystal layer.

Here, the circuit construction can be modified by changing the order of the sample-hold circuit 304 and the signal processing circuit 306.

The liquid crystal display panel shown in FIG. 11 may be a color liquid crystal display panel capable of displaying multiple colors. In this case, the individual display R, G, B data are individually converted into video signals by a D/A converter 302, individually divided into six phases by the sample-hold circuit 304 and fed to the video signal lines (S1 to S6) of the liquid crystal display panel.

In the multicolor liquid crystal display panel, however, the liquid crystal display panel shown in FIG. 11 needs to be equipped with the R, G and B thin film transistors (TFT), R, G and B video signal lines (D) and color filters to feed the R, G and B video signals to the individual video signal lines (D).

On the basis of a horizontal synchronous signal (H-SYNC), a vertical synchronous signal (V-SYNC) and a clock pulse (CLK) from the main body, the control IC circuit 301 constructed of one semiconductor integrated circuit (LSI) generates a horizontal driving clock signal (CLX), a vertical driving clock signal (CLY) a sampling/holding (S/H) clock, and so on.

The driver IC circuit 305 amplifies the horizontal driving clock signal (CLX), the vertical driving clock signal (CLY) and so on to voltages high enough to operate the liquid crystal display panel (TFT-LCD).

By thus providing the back light shielding film (BS), in this embodiment, it is possible to prevent the thin film transistors (TFT) from malfunctioning due to the light which enters the thin film transistors (TFT) from the display face side opposed to the light source (50 in FIG. 1) side.

Since the gate voltage to be applied to the scanning signal lines (G) is applied to the back light shielding film (BS), the leakage current when the thin film transistors (TFT) are off can be decreased, but the on current when the thin film transistors (TFT) are on can be increased.

As a result, the video signal voltages can be sufficiently written in the individual pixels, and the video signal voltages written in the pixels can be held for a long time, so that a satisfactory image can be achieved.

Here, a voltage synchronized with the gate voltage (Vg) to be applied to the gate electrodes may be applied to the back light shielding film (BS) constituting the backgate electrodes.

Figure 13:
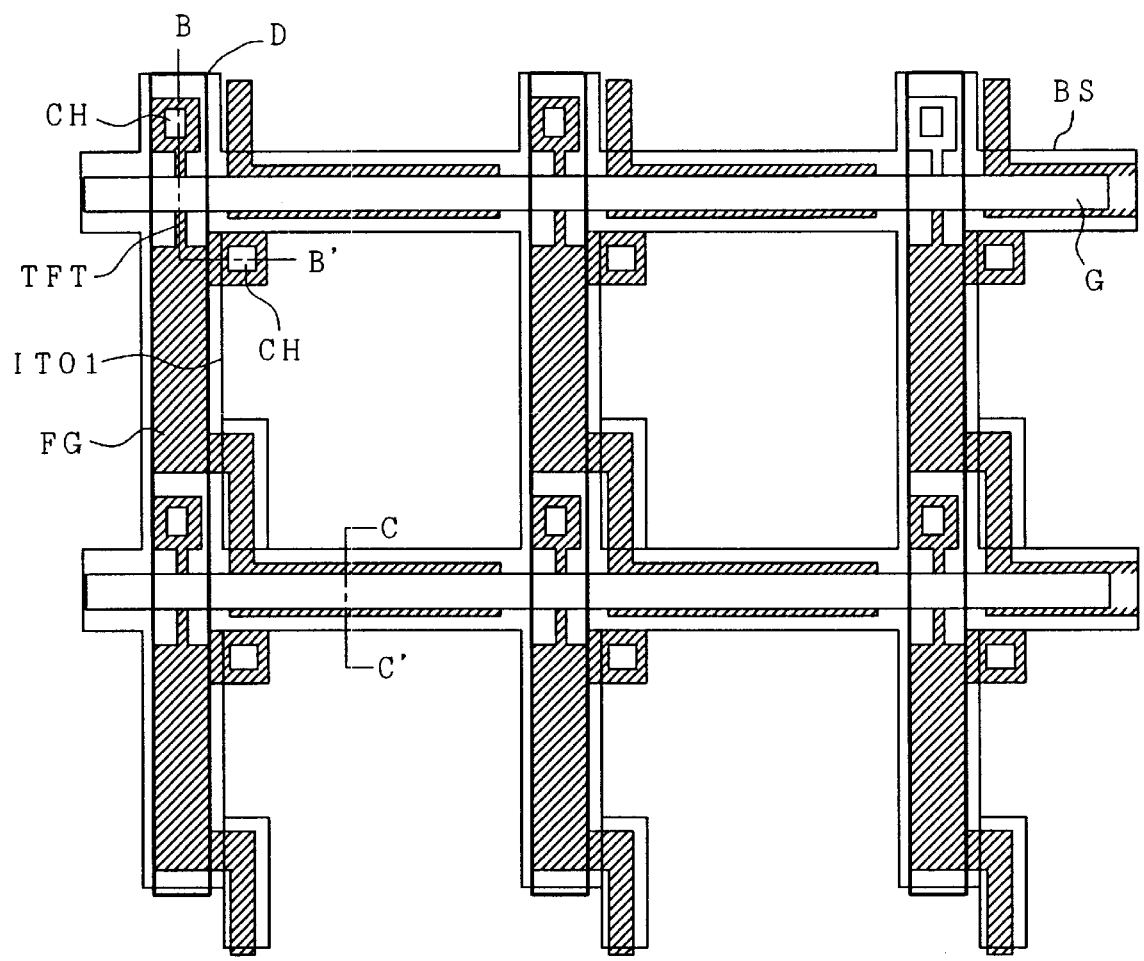
FIG. 13 is a diagram showing a schematic construction of the pixel portion of the liquid crystal display device of the embodiment of the invention.
Figure 14:
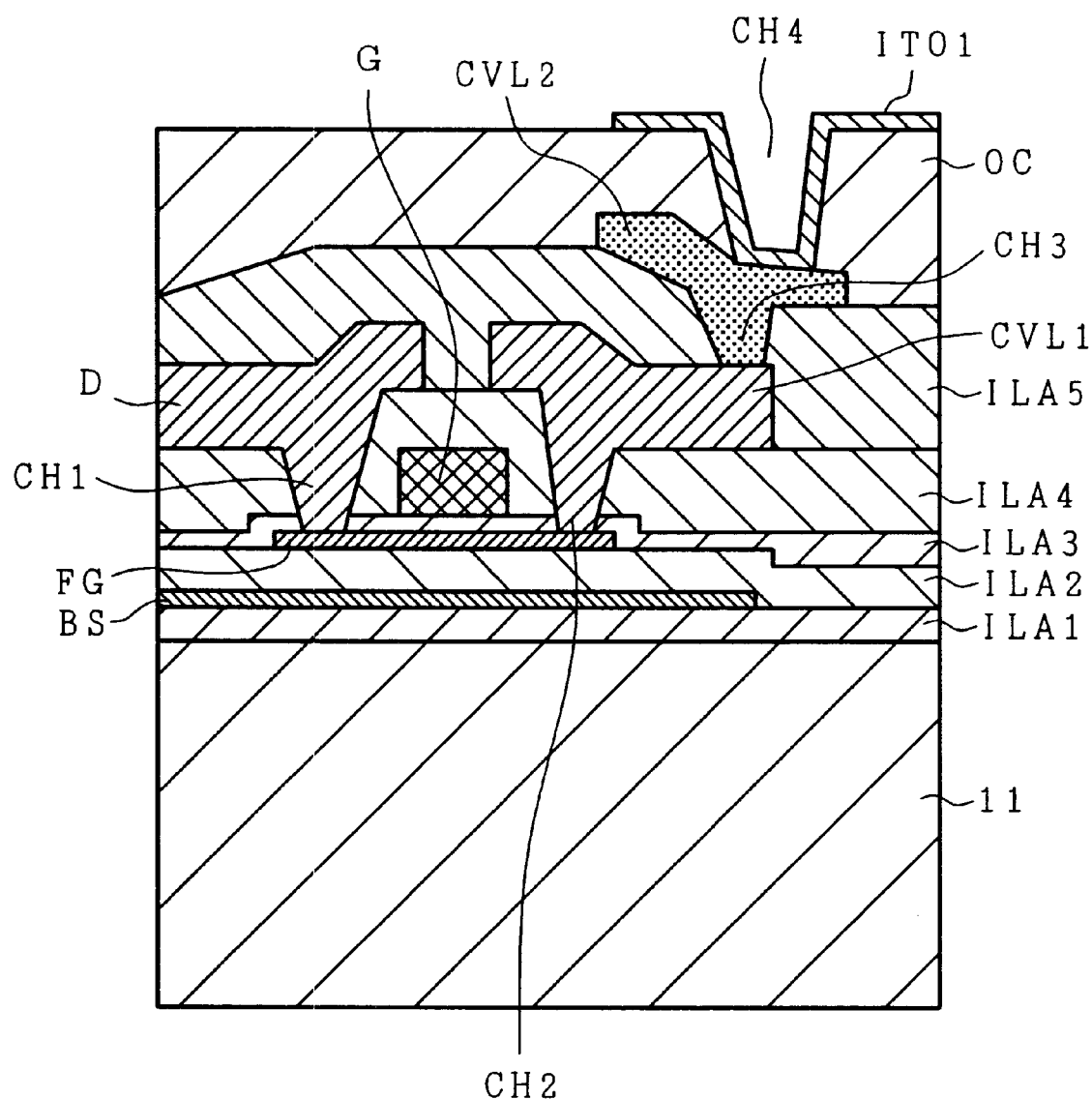
FIG. 14 is a cross-sectional viewing taken along line B–B' of FIG. 13.
Figure 15:
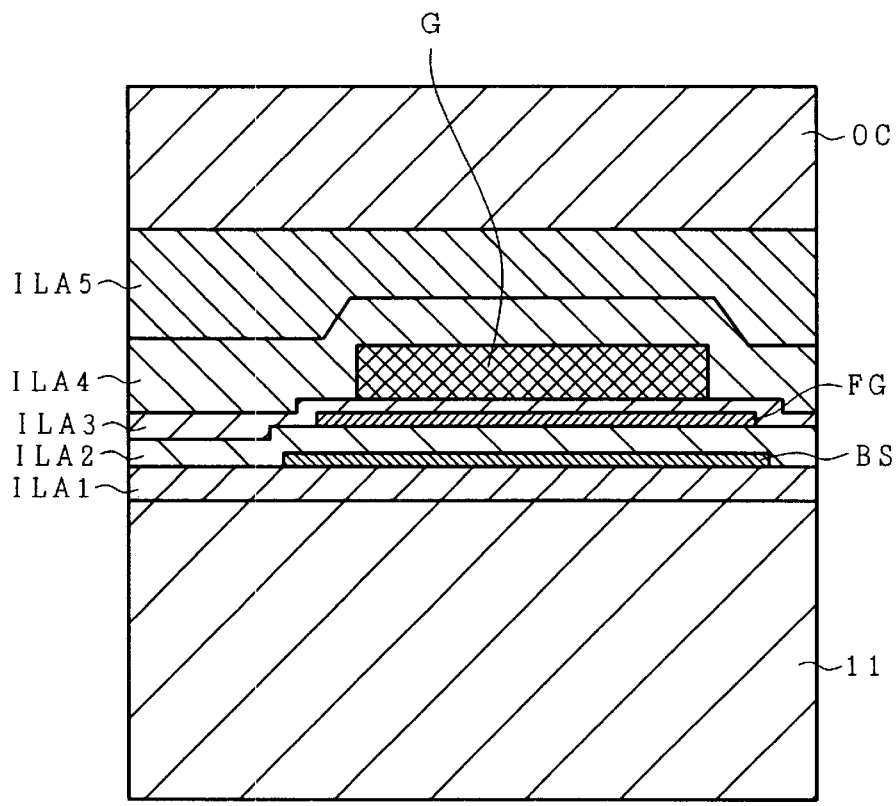
FIG. 15 is a cross-sectional viewing taken along line C–C' of FIG. 13.

FIG. 13 is a diagram showing a schematic construction of the pixel portion 12 of the TFT electrode substrate 10 of the embodiment of the invention, FIG. 14 is a section taken along line B–B' of FIG. 13, and FIG. 15 is a section taken along line C–C' of FIG. 13.

Here in FIGS. 13 to 15, the same reference symbols as those of FIGS. 3 and 4 designate the same components as those of FIGS. 3 and 4, and their description will be omitted. As in FIG. 3, FIG. 13 shows layers including a layer for forming the video signal line (D) and the pixel electrode (ITO1) of FIG. 14, but the connection from the video signal lines (D) to the pixel electrode (ITO1) and the interlayer insulating films are omitted so that the construction of the individual portions may be easily understood.

In this embodiment, as shown in FIGS. 13 to 15, the back light shielding film (BS) is formed in parallel crosses over the substrate insulating film (ILA1), and the video signal lines (D) and the scanning signal lines (G) are formed over the parallel section back light shielding film (BS).

The source region (SFG) of the poly-silicon layer (FG) is extended over a first interlayer insulating film (ILA2) to the region below the video signal lines (D) and to the region below the gate signal lines (G) at the succeeding stage (or preceding stage).

Since a constant voltage (e.g., the voltage Vcom to be applied to the common electrode (ITO2)) is applied to the parallel cross back light shielding film (BS), moreover, a storage capacitor (Cadd) is constructed of the region below the video signal lines (D), the source region (SFG) below gate signal lines (G) at the succeeding stage (or preceding stage) and the parallel cross back light shielding film (BS).

In this embodiment, therefore, the capacitor line (C) can be dispensed with, so that the aperture ratio of each pixel can be accordingly improved. Since the back light shielding film (BS) is so formed as to enclose the pixel electrode (ITO1), moreover, the light which might otherwise leak therefrom can be blocked to raise the contrast ratio.

In the liquid crystal display panel actually manufactured by the inventor, the aperture ratio of the pixel could be improved to 55%.

In the liquid crystal display device of the prior art, a high resolution of the liquid crystal display panel has been demanded, so that the resolution has been raised, for example, from 640×480 pixels in the VGA display mode to 800×600 pixels in the SVGA display mode. In accordance with the demand of a larger screen of the liquid crystal display panel of recent years, a still higher resolution, 1,024×768 pixels or more in the XGA display mode 1,280× 1,024 in the SXGA display mode or 1,600×1,200 pixels in the UXGA display mode) has been demanded.

Liquid crystal display devices used in liquid crystal projector have been also required to have such high resolution. In liquid crystal display devices used in liquid crystal projectors, however, the size of the liquid crystal display panel is restricted, so that the high resolution reduces the size of the individual pixels, lowering the brightness of the image displayed on the screen (the display image is dark).

This makes it necessary to increase the illuminance of the light emitted from the light source. This necessity causes a problem that the electric power to be consumed by the light source rises.

In this embodiment, however, the capacitor line (C) can be dispensed with, so that the aperture ratio of each pixel can be accordingly improved to make it unnecessary to raise the power consumption of the light source.

Figure 16:
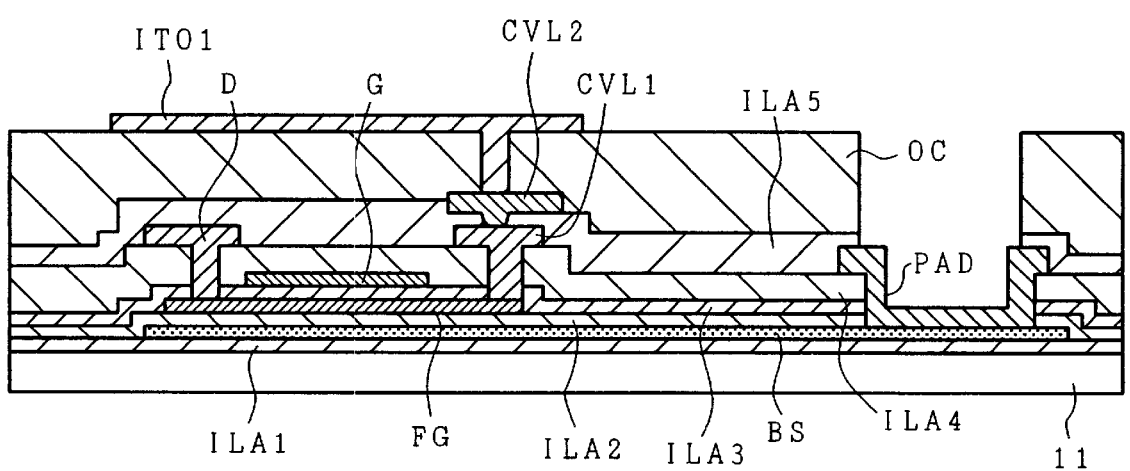
FIG. 16 is a cross-sectional viewing an essential portion of one example of a structure for applying a constant voltage to a back light shielding film in parallel crosses of the liquid crystal display device of the embodiment of the invention.

FIG. 16 is a section showing an essential portion of one example of the structure for applying a constant voltage to the back light shielding film (BS) in parallel crosses in this embodiment.

In this structure shown in FIG. 16, there is disposed in the peripheral portion of the pixel portion 12 of the TFT electrode substrate 10 shown in FIG. 1 a pad portion (PAD) which is made up of a metal film of Al or the like. A constant voltage (e.g., the voltage Vcom to be applied to the common electrode (ITO2)) is applied through the pad portion (PAD).

Figure 17:
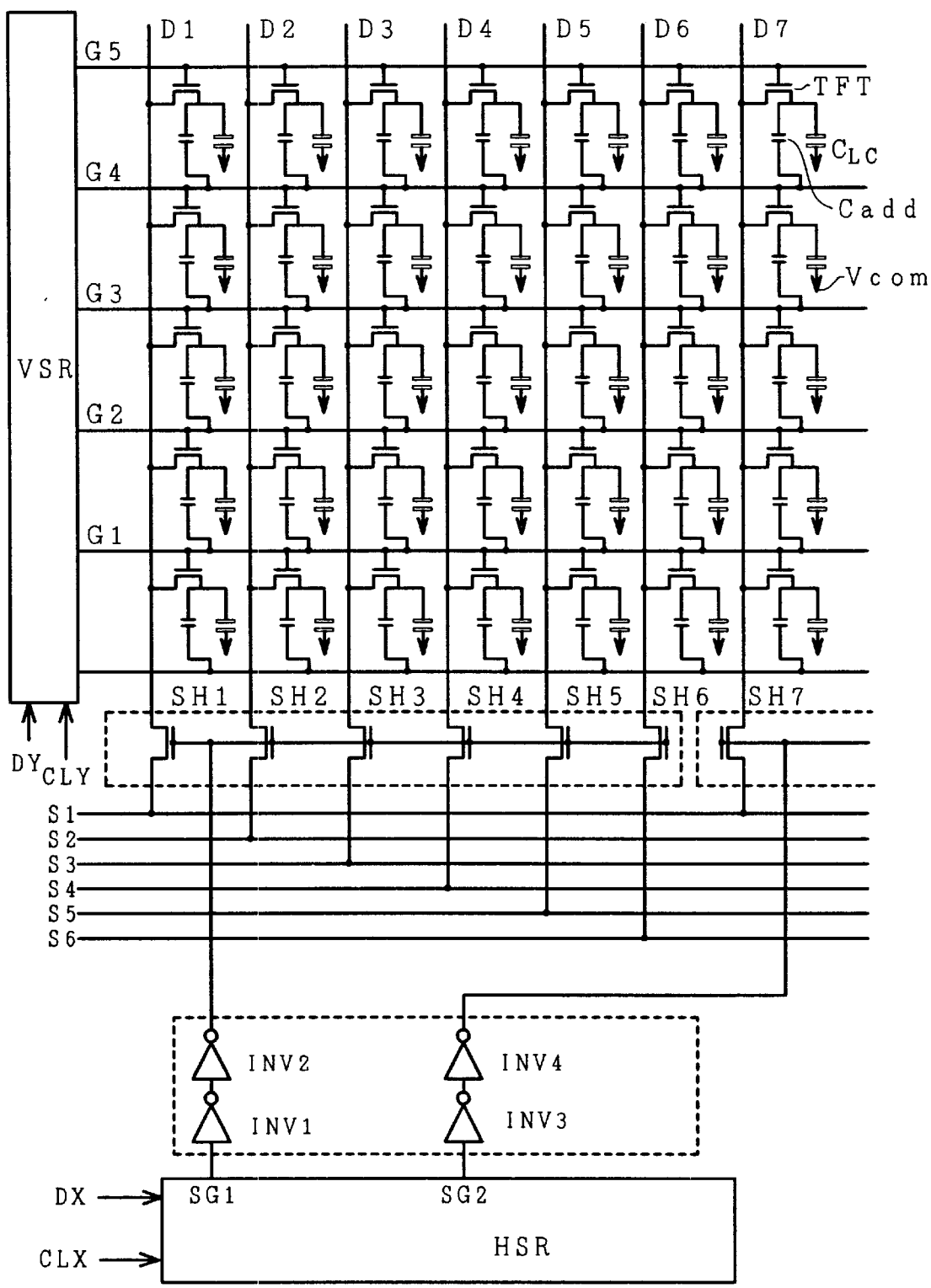
FIG. 17 is a diagram showing an equivalent circuit of the liquid crystal display device of the embodiment of the invention.

FIG. 17 is a diagram showing an equivalent circuit of the liquid crystal display panel of the liquid crystal display device of this embodiment.

Figure 18:
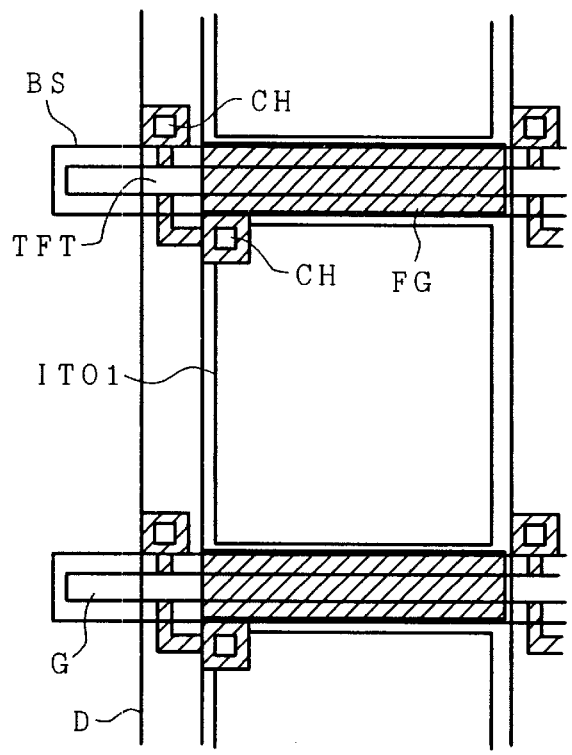
FIG. 18 is a diagram for illustrating another example of the back light shielding film of the liquid crystal display device of the embodiment of the invention.

Here in this embodiment, the back light shielding film (BS) is formed in parallel crosses. The form of the back light shielding film (BS) should not be limited thereto but can be modified, as shown in FIG. 18. That is, it is disposed in parallel with the gate signal lines (G) to extend the source region (SFG) of Poly-SiTr (FG) to the region below the gate signal lines (G).

Figure 19:
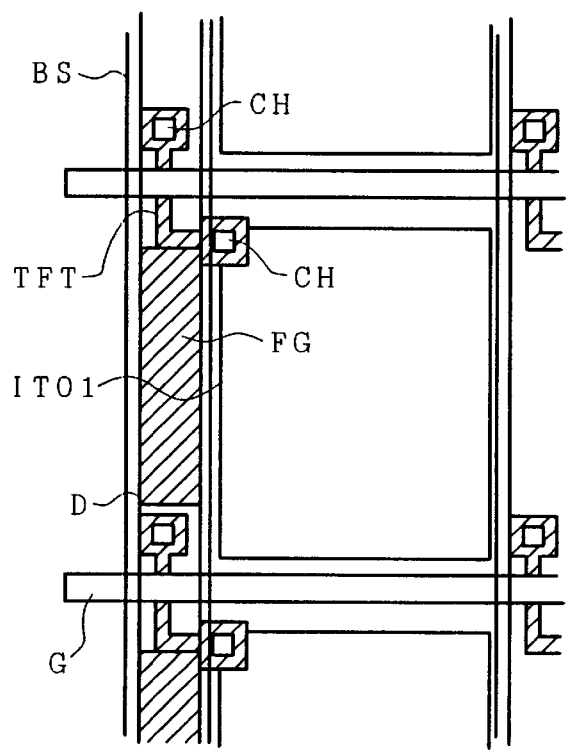
FIG. 19 is a diagram for illustrating still another example of the back light shielding film of the liquid crystal display device of the embodiment of the invention.

As shown in FIG. 19, the back light shielding film (BS) may be formed in parallel with the video signal lines (D) to extend the source region (SFG) of Poly-SiTr (FG) to the region below the video signal lines (D).

In this embodiment, moreover, the source region (SFG) of the poly-silicon layer (FG) is extended to construct the capacitive element between the extended portion of the source region (SFG) and the back light shielding film (BS). In place of the extension of the source region (SFG) of the poly-silicon layer (FG), however, it is possible to form a metal film of Al or a refractory metal, for example.

With reference to FIGS. 20 to 25, there is shown the construction of the pixel portion of the case in which the back light shielding film (BS) is provided with a portion parallel to the gate signal lines (G) and a portion parallel to the video signal lines (D).

Figure 20:
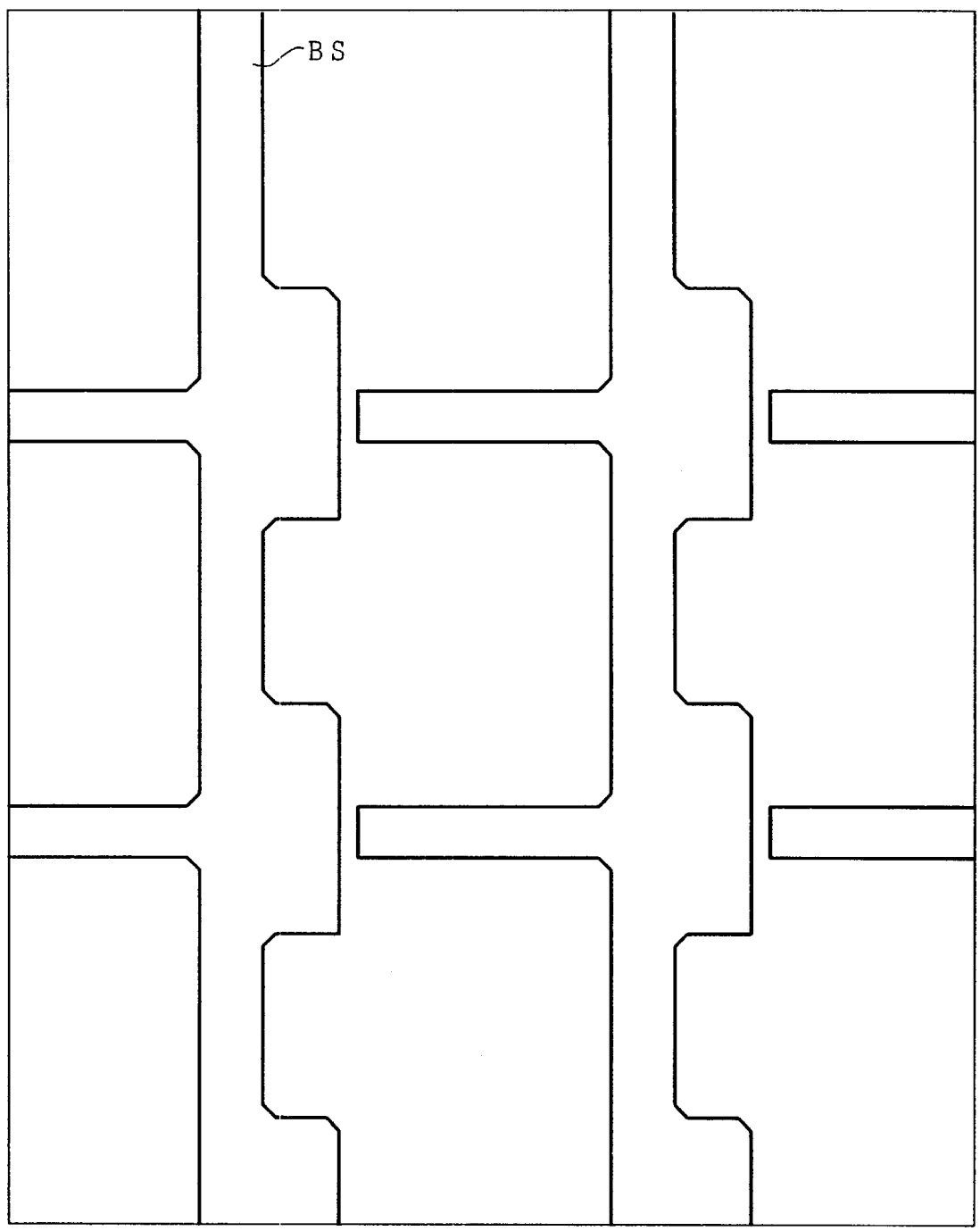
FIG. 20 is a diagram for illustrating the construction of the pixel portion of the liquid crystal display device of the embodiment of the invention.

As shown in FIG. 20, the metal film is formed over the quartz substrate by a sputtering method, for example, and is then patterned to form the back light shielding film (BS). This back light shielding film (BS) is constructed to include a portion (BSG) formed in parallel with the gate signal lines (G) to constitute the capacitive element, a portion (BSD) formed in parallel with the video signal lines (D) to constitute the capacitive element, and a portion (BSFG) acting as the light shielding film of the poly-silicon layer (FG) which is the semiconductor layer of the thin film transistor. Here, the individual layers of FIG. 20 are formed one on another, as shown in FIG. 8B.

Figure 21:
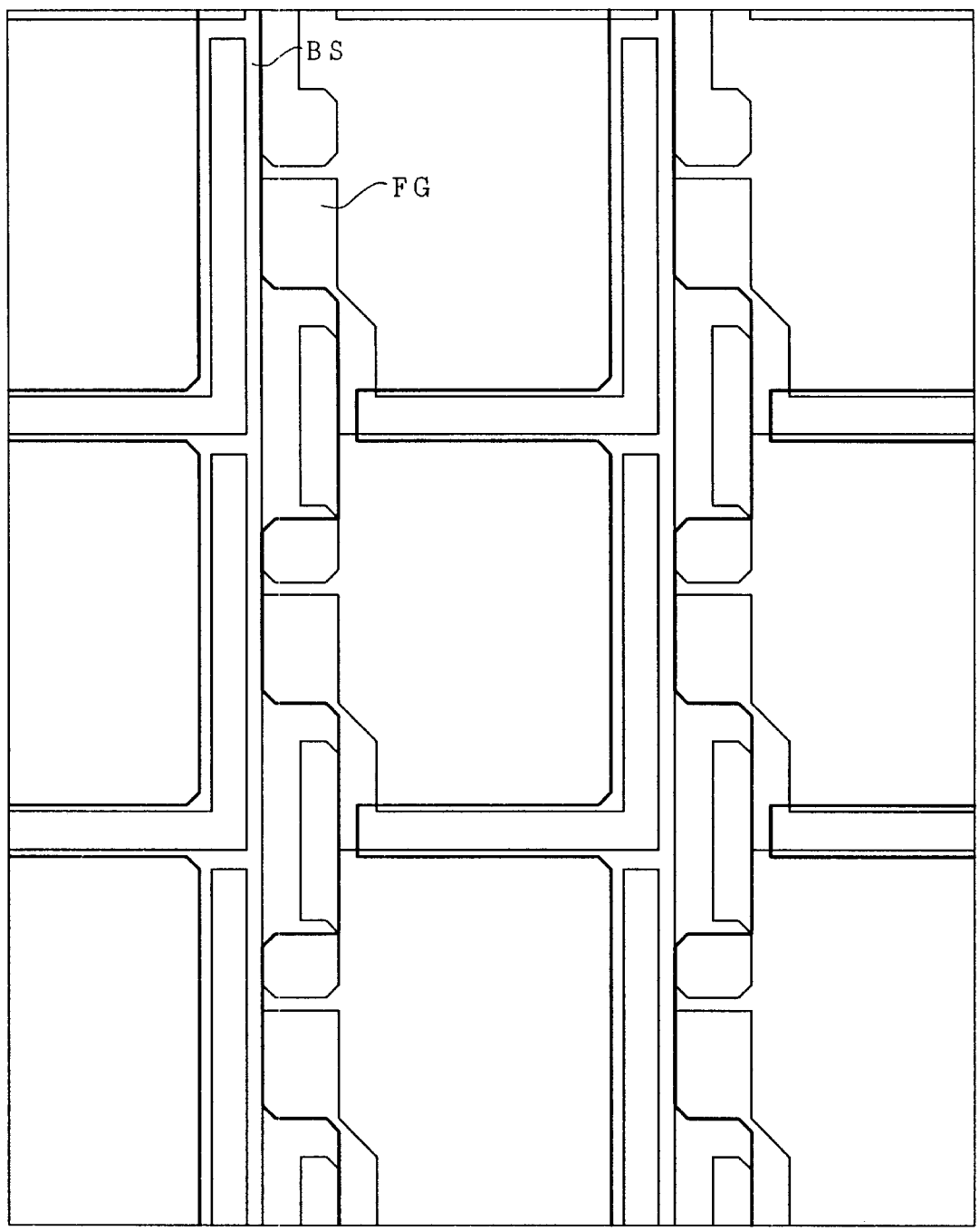
FIG. 21 is a diagram for illustrating the construction of the pixel portion of the liquid crystal display device of the embodiment of the invention.

Next, as shown in FIG. 21, after the substrate insulating film (ILA1) and the first interlayer insulating film (ILA2) are formed (although not shown), the poly-silicon is formed by a CVD method, for example, and is patterned to form the poly-silicon layer (FG). Most part of the poly-silicon layer (FG) is formed over the back light shielding film (BS), but the source region (SFG) and the drain region (DFG) are formed in an area other than the area over the back light shielding film (BS). However, this back light shielding film (BS) covers the portion where the dosage of ions in the periphery of the gate electrodes forming the LDD structure is lower than that of the source region (SFG) or the drain region (DFG), that is, the portion where malfunction such as photoconduction may be caused by the incidence of light.

The poly-silicon layer (FG) is provided with a portion (FGCD) formed in parallel with the video signal lines (D) to constitute the capacitive element, and a portion (FGCG) formed in parallel with the gate signal lines (G) to constitute the capacitive element. Here, the individual layers of FIG. 21 correspond to those of FIG. 8(d).

Figure 22:
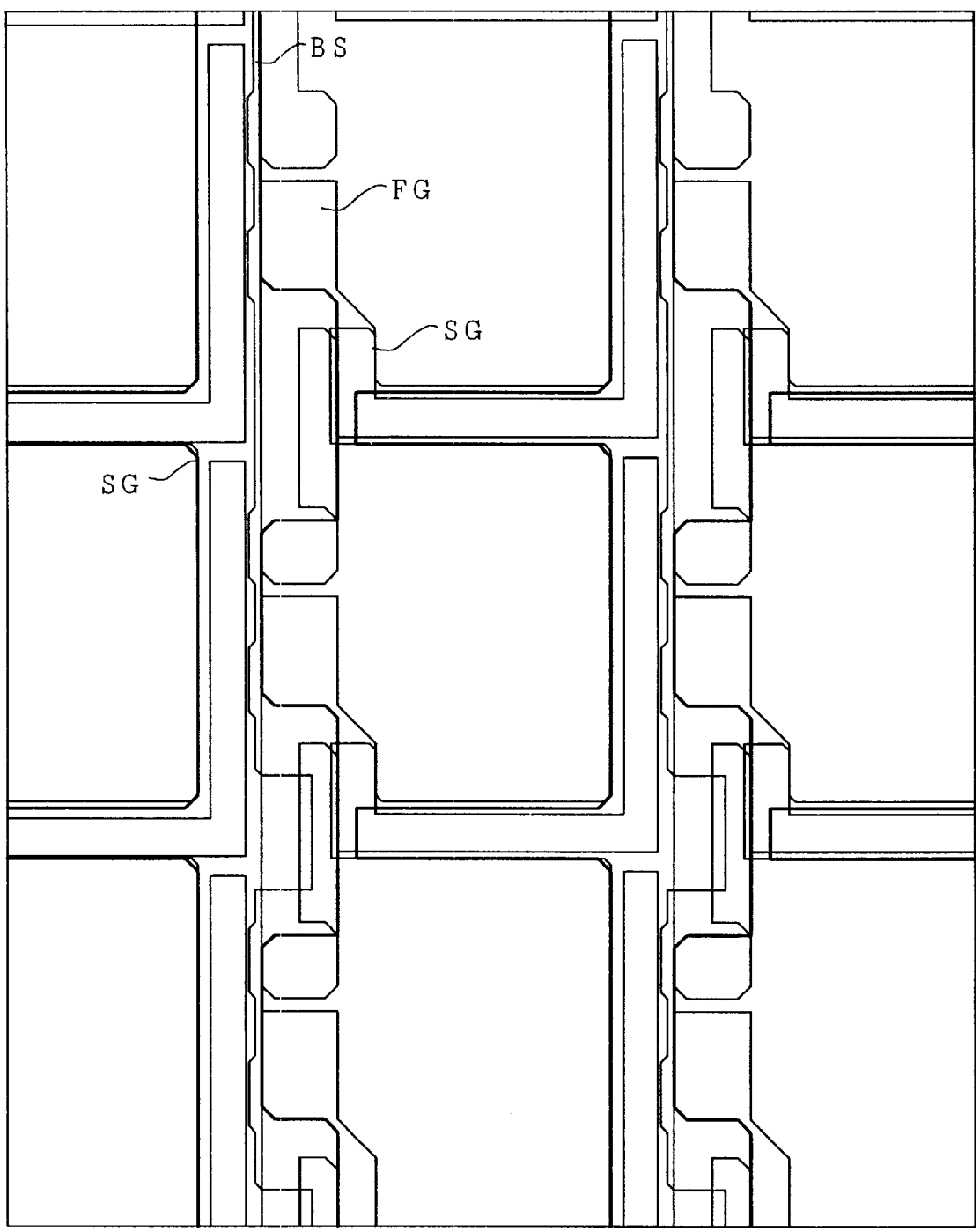
FIG. 22 is a diagram for illustrating the construction of the pixel portion of the liquid crystal display device of the embodiment of the invention.

Next, as shown in FIG. 22, after a second interlayer insulating film (ILA3) is formed (although not shown), the second poly-silicon layer is formed by a CVD method, for example, and is then patterned to form the scanning signal lines (G). Gate electrodes (GT) are formed for the scanning signal lines (G). There is also formed a portion (GD) which is disposed in parallel with the video signal lines (D) to constitute the capacitive element. Here, the individual layers of FIG. 22 correspond to those of FIG. 8(f).

Figure 23:
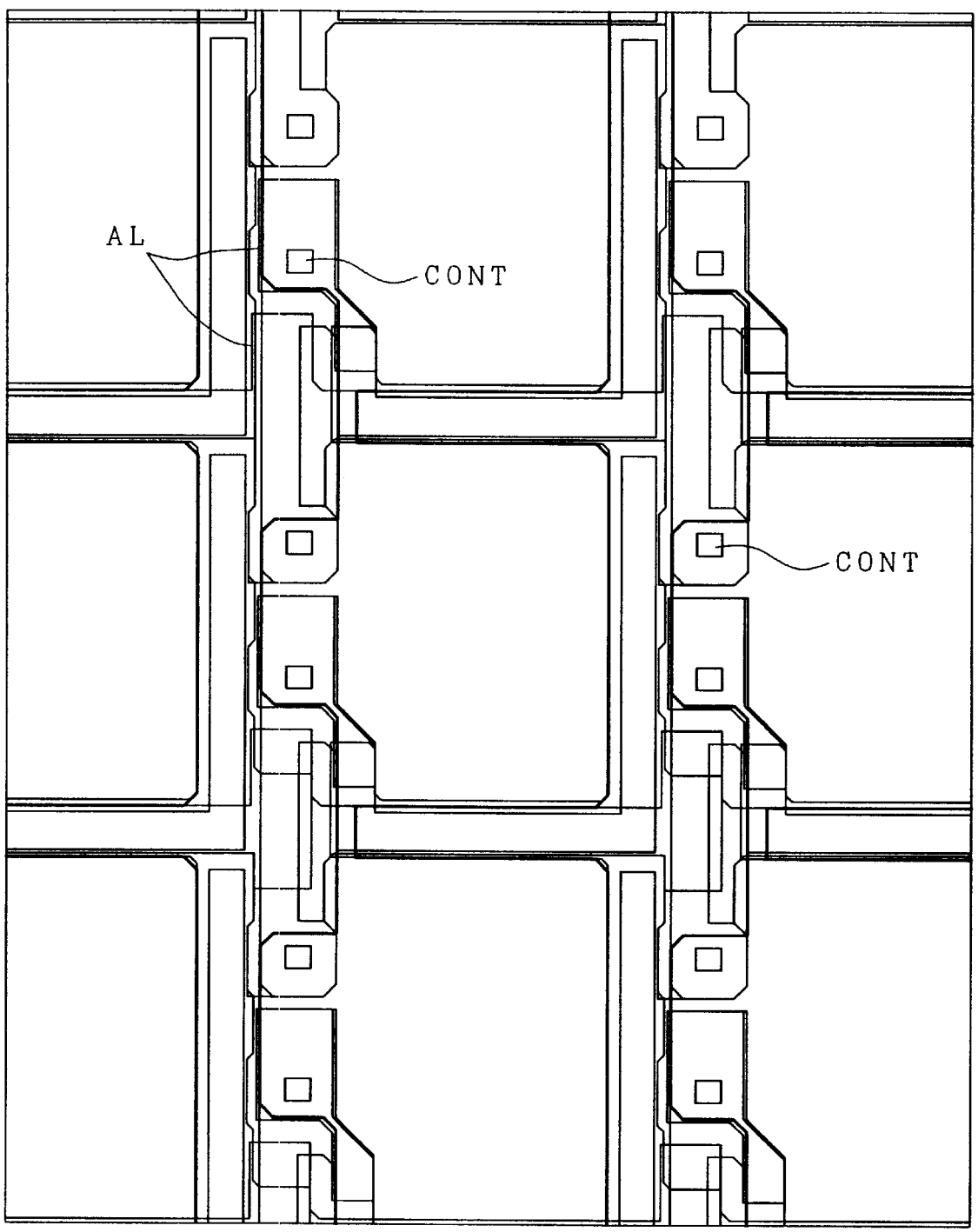
FIG. 23 is a diagram for illustrating the construction of the pixel portion of the liquid crystal display device of the embodiment of the invention.

Next, as shown in FIG. 23, after a third interlayer insulating film (ILA4) is formed (although not shown), the through hole (CH1) and the through hole (CH2) are formed in the third interlayer insulating film (ILA4), and a metal film of aluminum or the like is formed over the third interlayer insulating film (ILA4) by a sputtering method, for example, to form the video signal lines (D) and the first conductor film (CLV1). The individual layers of FIG. 23 correspond to those of FIG. 9(b).

Figure 24:
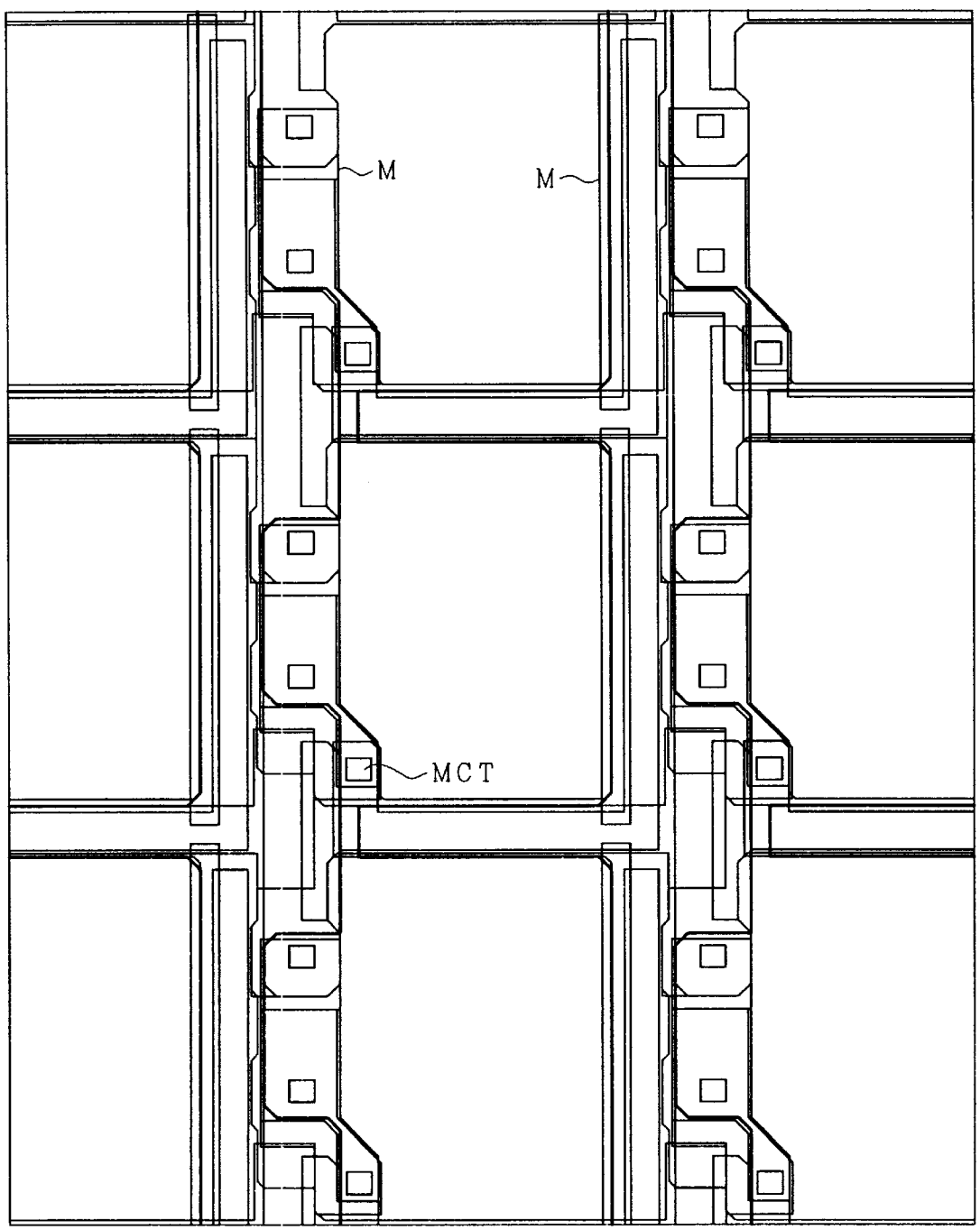
FIG. 24 is a diagram for illustrating the construction of the pixel portion of the liquid crystal display device of the embodiment of the invention.

Next, as shown in FIG. 24, after a fourth interlayer insulating film (ILA5) is formed and the through hole (CH3) is formed, a metal film of aluminum or molybdenum is formed by a sputtering method, for example, and is then patterned to form the second conductor film (CLV2). The individual layers of FIG. 24 correspond to those of FIG. 9(e).

Figure 25:
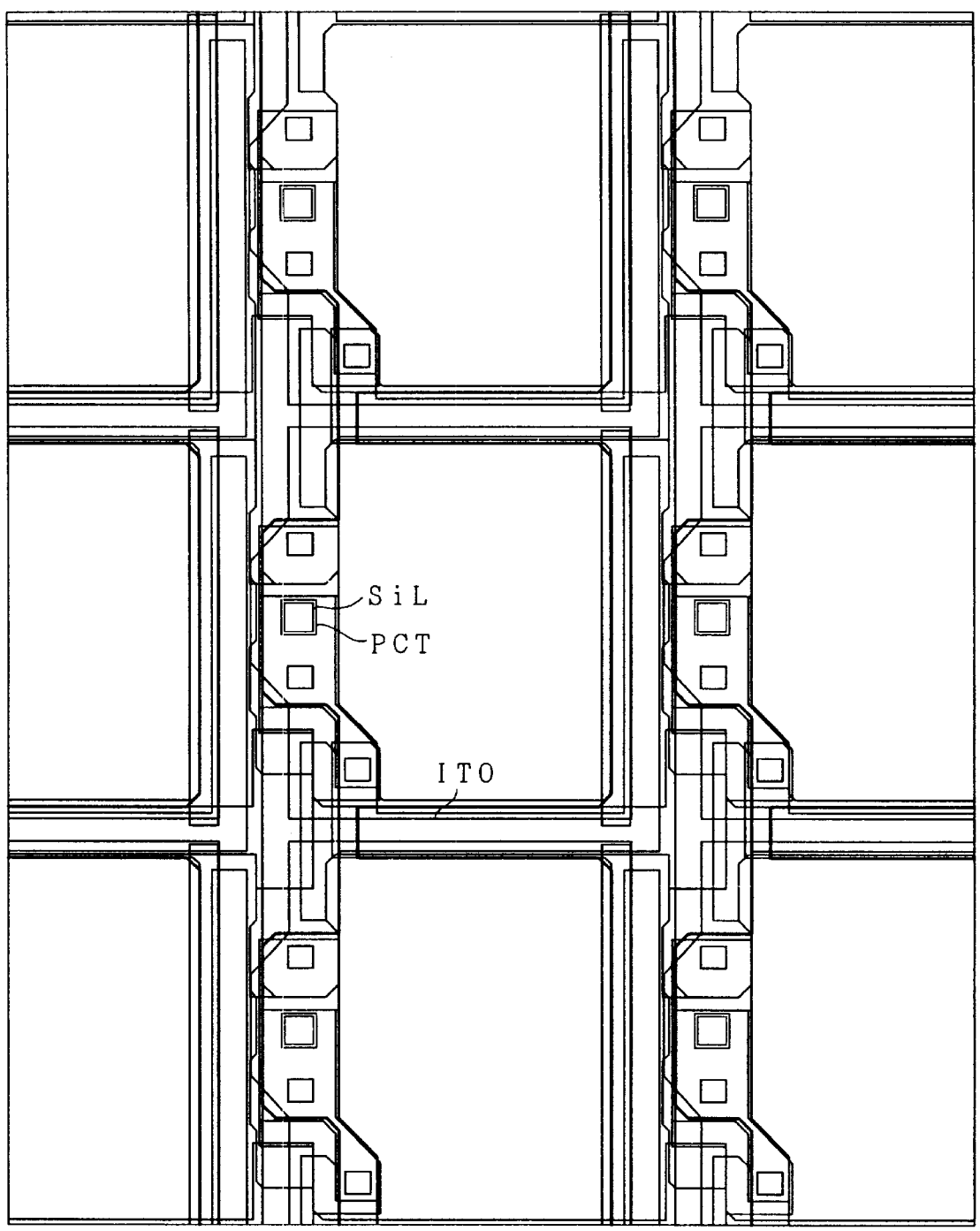
FIG. 25 is a diagram for illustrating the construction of the pixel portion of the liquid crystal display device of the embodiment of the invention.

Next, as shown in FIG. 25, after the planarizing film (OC) (although not shown) is formed, an ITO film is formed by a sputtering method, for example, to form the pixel electrode (ITO1). The individual layers of FIG. 25 correspond to those of FIG. 10(b).

Figure 26:
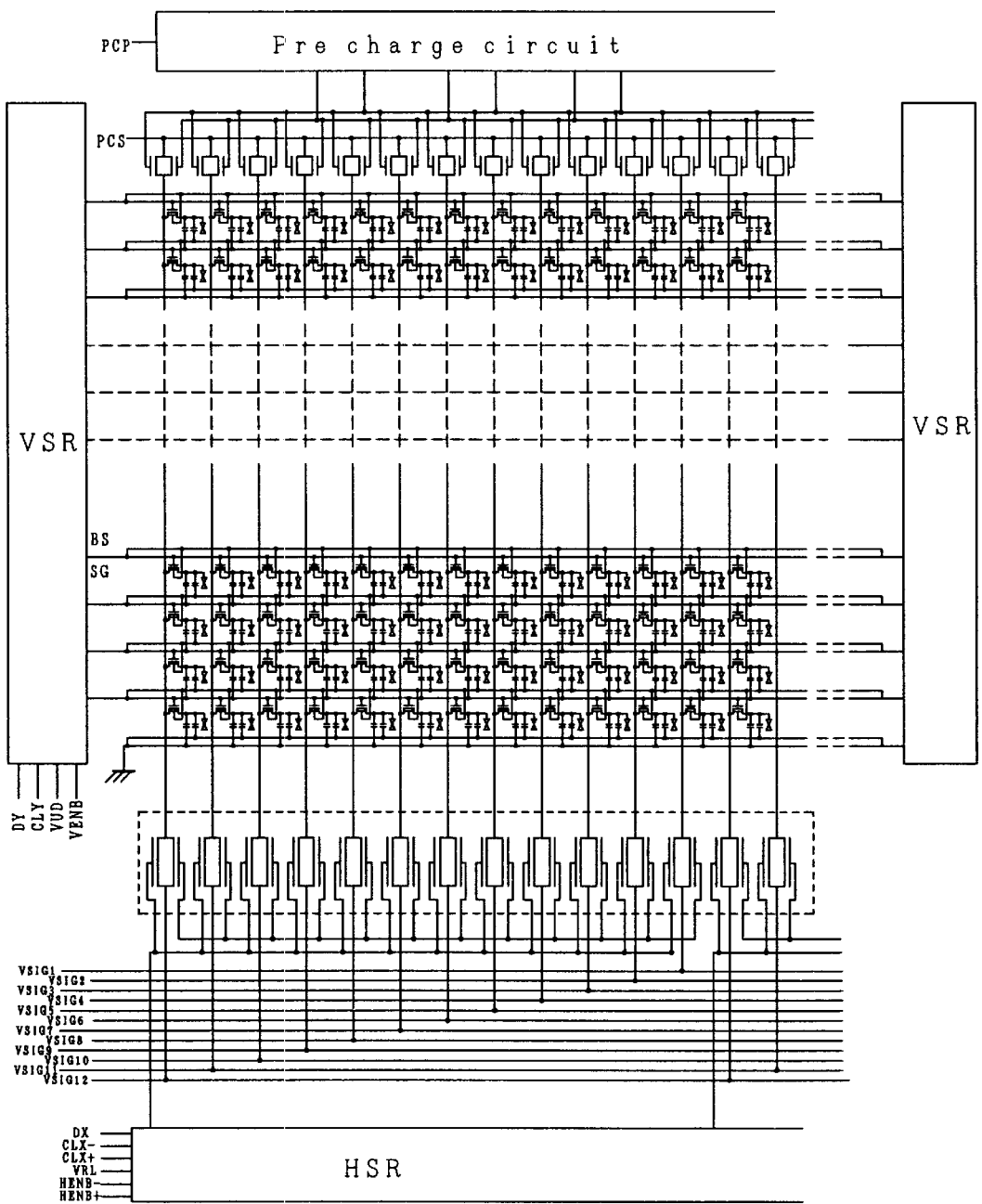
FIG. 26 is a diagram showing an equivalent circuit of the liquid crystal display device of the embodiment of the invention.

FIG. 26 is an equivalent circuit diagram of the embodiment which has been described with reference to FIGS. 20 to 25. The back light shielding film (BS) and the scanning signal lines (G) constitute the capacitive element. This capacitive element is a holding capacitor. This holding capacitor is formed in parallel with the pixels to hold the charges of the pixels commonly.

This holding capacitor is constructed by sandwiching the poly-siliconwlayer (FG) described with reference to FIG. 21 between the back light shielding film (BS) described with reference to FIG. 20 and the scanning signal lines (G) described with reference to FIG. 22.

The back light shielding film (BS) is connected with the scanning signal lines (G), so that it acts as the backgate electrode as in the foregoing other embodiments.

Figure 27:
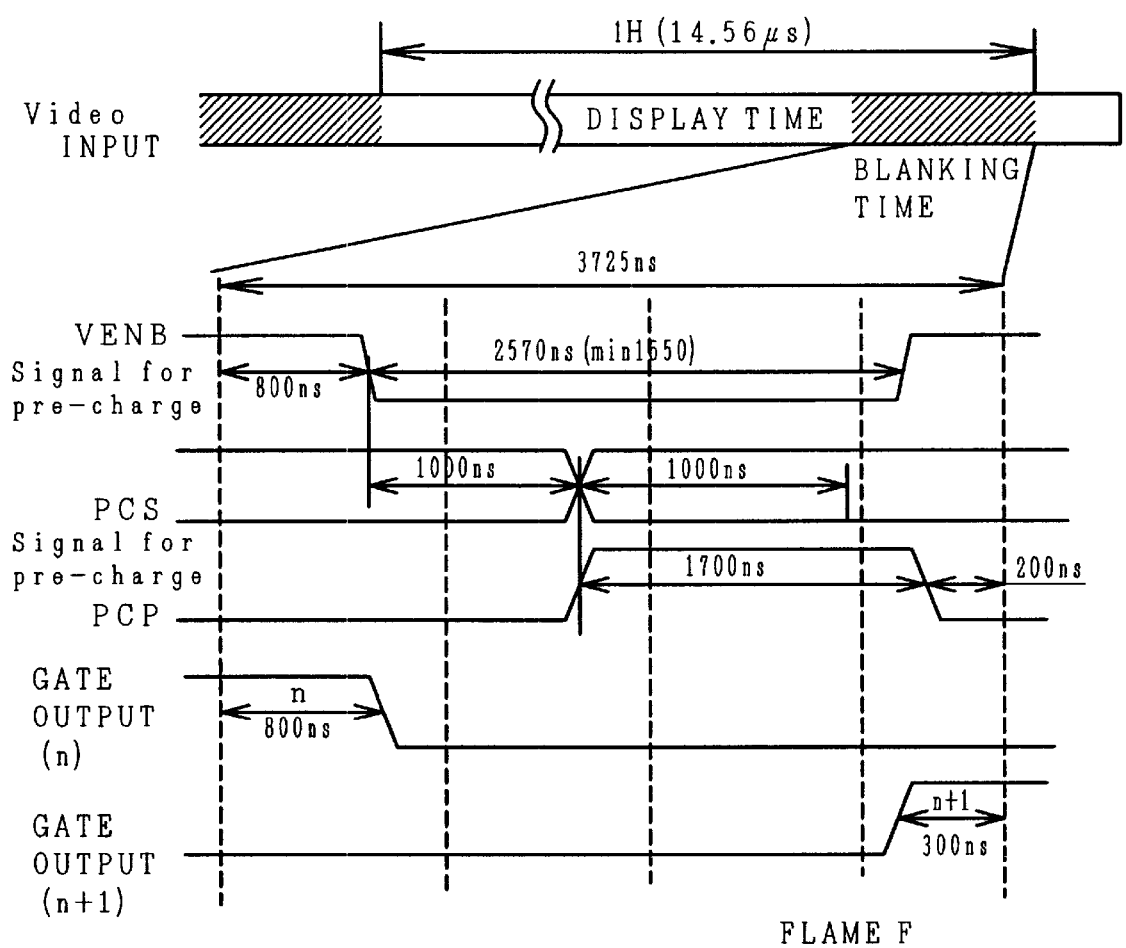
FIG. 27 is a diagram for illustrating the output waveforms of scanning signals of the liquid crystal display device of the embodiment of the invention.

FIG. 27 is a diagram for illustrating a scanning signal (VOUT) outputted to the back light shielding film (BS) and the scanning signal lines (G). In the equivalent circuit shown in FIG. 26, the individual scanning signal lines are selected sequentially downward or upward to output a positive voltage for a predetermined period (1H). A blanking period is provided between the output periods of the individual scanning signals. When the back light shielding film (BS) and the scanning signal lines (G) constitute the holding capacitor and the back light shielding film (BS) is made to serve as the backgate electrode, the noise is suppressed to a level of no problem even if the scanning is performed downward or upward, so that the drive can be inverted. In the case of this inverted drive, however, the overlap of the outputs of a scanning signal (VOUT1) and the next scanning signal (VOUT2) causes a problem that the potentials of the back light shielding film (BS) and the scanning signal lines (G) constituting the holding capacitor, rise before the thin film transistors (TFT) of the pixels are sufficiently turned off. For the blanking period, therefore, a scan ending signal (VENB) is interposed with a sufficient interval between the scanning signal (VOUT) and the scanning signal (VOUT), so that the scanning signal (VOUT) is not outputted while the scan ending signal (VENB) is being outputted. Here in FIG. 27, the AND of the scanning signal (VOUT) and the scan ending signal (VENB) is outputted, so that the scan ending signal (VENB) takes on a low level while the scanning signal (VOUT) is not outputted.

Figure 28:
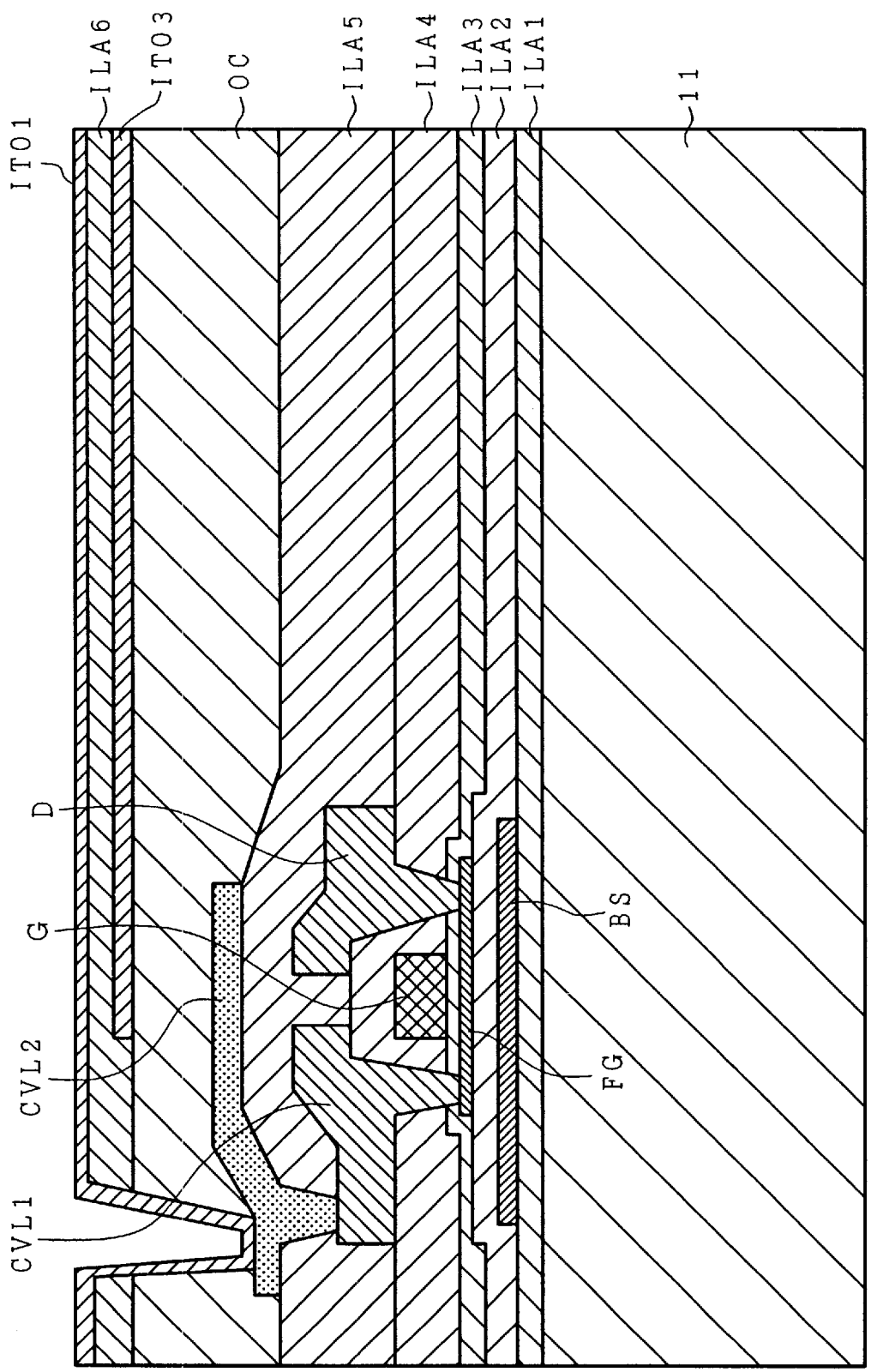
FIG. 28 is a diagram for illustrating a sectional construction of the pixel portion of the liquid crystal display device of the embodiment of the invention.

FIG. 28 is a section showing essential parts of the pixel portion 12 of the TFT electrode substrate 10 of the embodiment of the invention.

Here in FIG. 28, the same reference symbols as those of FIGS. 3 and 4 designate the same components as those of FIGS. 3 and 4, and their description will be omitted.

In this embodiment, as shown in FIG. 28, a transparent conductor film (ITO3) of an ITO film is formed over the planarizing film (OC), a fifth interlayer insulating film (ILA6) is formed over the transparent conductor film (ITO3), and the pixel electrode (ITO1) is formed over the interlayer insulating film (ILA6).

Figure 29:
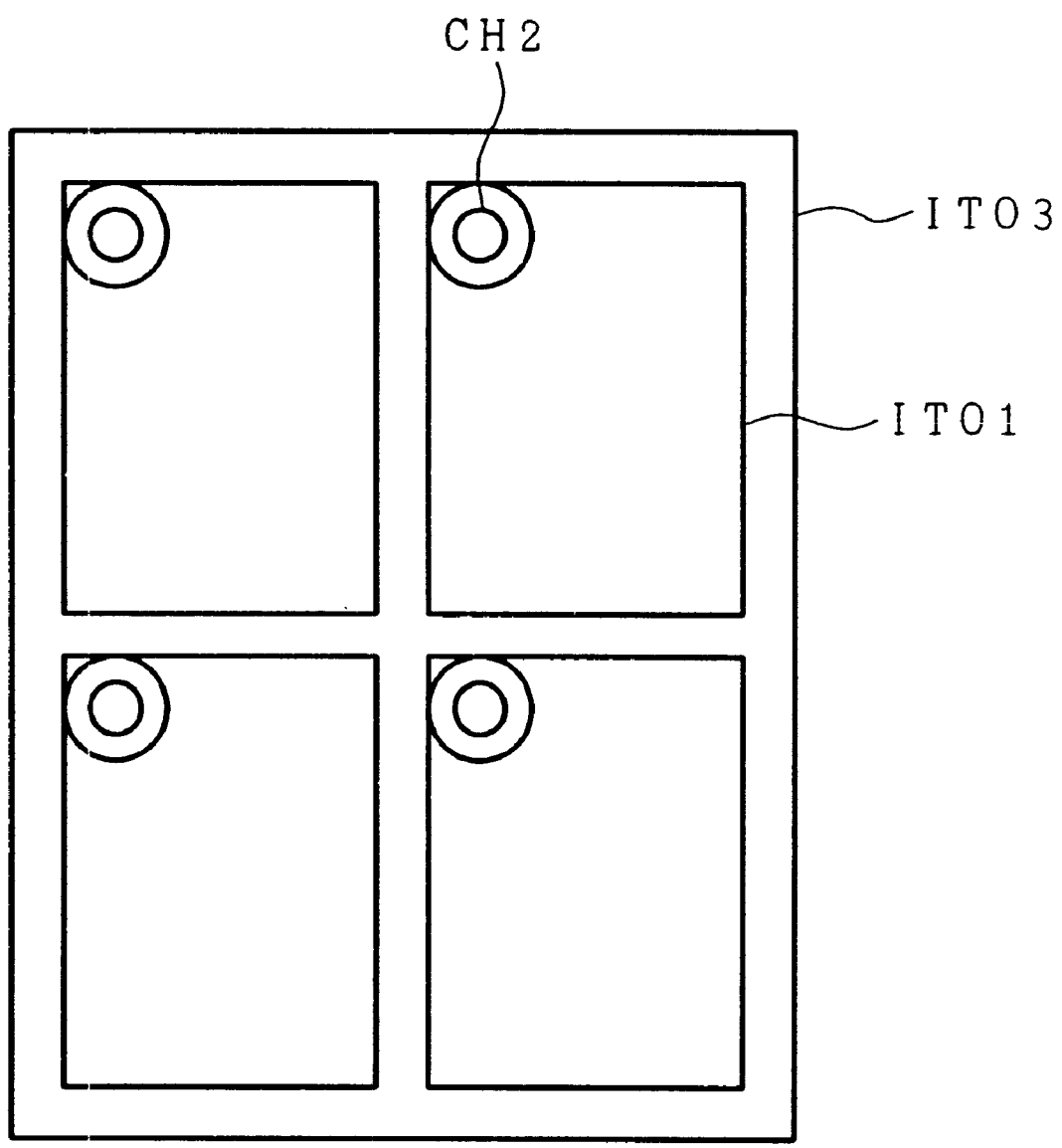
FIG. 29 is a diagram for illustrating a transparent conductive film of the liquid crystal display device of the embodiment of the invention.

In this case, as shown in FIG. 29, the transparent conductor film (ITO3) is formed all over the pixel portion 21 excepting the pixel electrode (ITO1) and the contact hole (CH4) connected with the second conductor film (CLV2).

A predetermined voltage (e.g., the voltage Vcom to be applied to the common electrode (ITO2)) is applied to the transparent conductor film (ITO3).

As a result, the pixel electrode (ITO1) and the transparent conductor film (ITO3) constitute the holding capacitor (Cadd).

In this embodiment, therefore, the capacitor line (C) can be dispensed with, so that the aperture ratio of each pixel can be accordingly improved.

Here in this embodiment the back light shielding film (BS) may serve as the backgate electrode as in the foregoing other embodiments, or the back light shielding film (BS) and the source region (SFG) of the poly-silicon layer (FG) may form a capacitor as in the foregoing other embodiments.

The transparent conductor film (ITO3) need not be formed all over the surface but may be formed in a plurality of bands in the row or column direction.

Here the foregoing individual embodiments have been described in conjunction with the embodiments in which the invention is applied to a TFT liquid crystal display device using poly-silicon transistors. However, the invention should not be limited thereto but can also be applied to a TFT liquid crystal display device using amorphous silicon transistors.

Our invention has been specifically described in connection with the foregoing embodiments, it should not be limited thereto but could naturally modified in various manners without departing from the gist thereof.

One effect of this embodiment is that since the first light shielding film is formed to block the light coming from the display face side of the liquid crystal display device and entering the semiconductor elements, the semiconductor elements can be prevented from malfunctioning.

Another effect of this embodiment is that since either the control voltage applied to the control electrode of the semiconductor element or a voltage synchronized with the former is applied to the first light shielding film, the leakage current when the semiconductor element is off can be decreased, the ON current when the semiconductor element is on can be increased, and hence a satisfactory image can be achieved.

What is claimed is:

1. A liquid crystal display device comprising:

two opposing substrates, at least one which is transparent, a liquid crystal layer interposed therebetween;

pixels formed over at least one of the two substrates, said pixels having a pixel electrode;

a thin film transistor connected to said pixel electrode of said pixels, said thin film transistor having a semiconductor layer with a first surface and a second surface;

a first gate electrode of said thin film transistor of said pixels located at a side of the first surface of said semiconductor layer;

a second gate electrode of said thin film transistor of said pixels located at a side of the second surface of said semiconductor layer;

a plurality of first scanning signal lines connected to said first gate electrode of said thin film transistor of said pixels for applying a control voltage to said first gate electrode of said thin film transistor of said pixels, said first scanning signal lines being located at the side of the first surface of said semiconductor layer;

a plurality of second scanning signal lines connected to said second gate electrode of said thin film transistor of said pixels for applying a control voltage to said second gate electrode of said thin film transistor of said pixels, said second scanning signal lines being located at the side of the second surface of said semiconductor layer; and a conductor layer which is extended from a source area of said thin film transistor and interposed between said first scanning signal lines and said second scanning signal lines;

wherein said thin film transistor is controlled by at least one control voltage applied to said first gate electrode and said second gate electrode.

2. A liquid crystal display device according to claim 1, wherein said first gate electrode and said second gate electrode are so provided as to face to each other through said semiconductor layer.

3. A liquid crystal display device according to claim 1, wherein said thin film transistor is controlled by the control voltage applied to said first gate electrode and said second gate electrode.

4. A liquid crystal display device according to claim 1, wherein said first gate electrode and said first scanning signal line includes a refractory metal silicide film.

5. A liquid crystal display device according to claim 1, further comprising:

a first capacity element having said conductor layer and said first scanning signal line as an electrode thereof;

a second capacity element having said conductor layer and said second scanning signal line as an electrode thereof.

6. A liquid crystal display device according to claim 1, wherein said first gate electrode shades the light from the side of the first surface into said semiconductor layer.

7. A liquid crystal display device according to claim 1, wherein said conductor layer is formed at the same step of forming said semiconductor layer, said conductor layer being lowered in resistance by doping said semiconductor layer with ions.

8. A liquid crystal display device comprising:

a liquid crystal panel having a plurality of pixels;

pixel electrodes provided in the pixels;

semiconductor elements provided in the pixels;

a semiconductor layer provided in said semiconductor elements;

a first control electrode provided in said semiconductor elements;

a second control electrode provided in said semiconductor elements;

a plurality of first control signal lines connected to said first control electrode of said semiconductor elements of said pixels;

a plurality of second control signal lines connected to said second control electrode of said semiconductor elements of said pixels;

a conductor layer interposed between said first control signal lines and said second control signal lines, said conductor layer being lowered in resistance by doping said semiconductor layer with ions;

wherein said semiconductor layer is formed between said first control electrode and said second control electrode; and each of said semiconductor elements is controlled by said first control electrode and said second control electrode.

9. A liquid crystal display device according to claim 8, wherein said first control electrode and said second control electrode are so formed as to face to each other through said semiconductor layer.

10. A liquid crystal display device according to claim 8, further comprising:

a drive circuit formed in said liquid crystal panel;

wherein said drive circuit is connected to said first control signal lines and to said second control signal lines for driving said first control electrode and said second control electrode simultaneously.

11. A liquid crystal display device comprising:

a first substrate and a second substrate;

a liquid crystal sandwiched between said first substrate and said second substrate;

a plurality of pixels formed over said first substrate;

semiconductor elements provided in the pixels, said semiconductor elements having a semiconductor layer;

a gate electrode of the semiconductor elements of the pixels formed to a liquid crystal side which is opposite said semiconductor layer;

a light shielding electrode of the semiconductor elements of the pixels formed to a first substrate side against said semiconductor layer, said light shielding electrode being made of a light shielding film;

a plurality of first gate signal lines formed to the first substrate side which is opposite said semiconductor layer, said first gate signal lines being connected to said light shielding electrode of the semiconductor elements of the pixels;

a plurality of second gate signal lines formed to said liquid crystal side which is opposite said semiconductor layer, said second gate signal lines being connected to said gate electrode of the semiconductor elements of the pixels; and wherein said plurality of first gate signal lines are formed of a light shielding film.

12. A liquid crystal display device according to claim 11, wherein said gate electrode and said light shielding electrode film are so formed as to face to each other through said semiconductor layer.

13. A liquid crystal display device according to claim 10, further comprising:

a conductor layer which is extended from a source area of said semiconductor elements and is sandwiched between said first gate signal lines and said second gate signal lines;

a first capacity element having two electrodes, one of said two electrodes being said conductor layer, and the other of said two electrodes being said first gate signal line;

a second capacity element having two electrodes, one of said two electrodes being said conductor layer, and the other of said two electrodes being said second gate signal line.

14. A liquid crystal display device according to claim 13, wherein said conductor layer is formed at the same step of forming said semiconductor layer, said conductor layer being lowered in resistance by doping said semiconductor layer with ions.

15. A liquid crystal display device according to claim 11, wherein said light shielding electrode and said first gate signal line includes a refractory metal silicide film.

16. A liquid crystal display device comprising:

a first and second substrate;

a plurality of pixels formed over said first substrate;

a plurality of first control signal lines formed over said first substrate;

a plurality of second control signal lines formed over said first control signal lines;

a first control electrode connected to said first control signal lines;

a second control electrode connected to said second control signal lines; and a switching element having a semiconductor layer with a first surface and a second surface, said switching element being controlled by a control signal applied to said first control electrode and to second control electrode;

wherein said first control electrode is located at a side of the first surface of said semiconductor layer, and said second control electrode is located at a side of the second surface of said semiconductor layer.

17. A liquid crystal display device according to claim 16, further comprising:

a conductor layer formed between said first control signal lines and said second control signal lines;

a first capacity element having two electrodes, one of said two electrode being said conductor layer, and the other of said two electrodes being said first control signal line; and a second capacity element having two electrodes, one of said two electrode being said conductor layer, and the other is second control signal line.

18. A liquid crystal display device according to claim 16, wherein said first control electrode shades the light from the side of the first surface into said semiconductor layer.

19. A liquid crystal display device according to claim 16, wherein said conductor layer is formed at the same step of forming said semiconductor layer, said conductive layer is lowered in resistance by doping said semiconductor layer with ions.

20. A liquid crystal display device according to claim 16, wherein said first control electrode and said first control signal line includes a refractory metal silicide film.

* * * * *